United States Patent
Yang et al.

(10) Patent No.: US 9,997,631 B2
(45) Date of Patent: Jun. 12, 2018

(54) METHODS FOR REDUCING CONTACT RESISTANCE IN SEMICONDUCTORS MANUFACTURING PROCESS

(71) Applicant: Taiwan Semiconductor Manufacturing Co., Ltd., Hsinchu (TW)

(72) Inventors: Cheng-Yu Yang, Changhua County (TW); Kai-Hsuan Lee, Hsinchu (TW); Sheng-Chen Wang, Hsinchu (TW); Sai-Hooi Yeong, Hsinchu (TW); Yi-Fang Pai, Hsinchu (TW); Yen-Ming Chen, Hsinchu County (TW)

(73) Assignee: TAIWAN SEMICONDUCTOR MANUFACTURING COMPANY (TW)

( * ) Notice: Subject to any disclaimer, the term of this patent is extended or adjusted under 35 U.S.C. 154(b) by 0 days. days.

(21) Appl. No.: 15/226,321

(22) Filed: Aug. 2, 2016

(65) Prior Publication Data
US 2017/0352762 A1    Dec. 7, 2017

Related U.S. Application Data

(60) Provisional application No. 62/345,576, filed on Jun. 3, 2016.

(51) Int. Cl.
| H01L 29/78 | (2006.01) |
| H01L 29/08 | (2006.01) |
| H01L 29/06 | (2006.01) |
| H01L 21/311 | (2006.01) |
| H01L 29/04 | (2006.01) |
| H01L 29/45 | (2006.01) |
| H01L 29/66 | (2006.01) |

(52) U.S. Cl.
CPC .... *H01L 29/7851* (2013.01); *H01L 21/31111* (2013.01); *H01L 29/045* (2013.01); *H01L 29/0649* (2013.01); *H01L 29/0847* (2013.01); *H01L 29/45* (2013.01); *H01L 29/66795* (2013.01)

(58) Field of Classification Search
CPC ......................... H01L 29/7851; H01L 29/045
See application file for complete search history.

(56) References Cited

U.S. PATENT DOCUMENTS

| 7,033,916 | B1 * | 4/2006 | Pelella | H01L 21/26506 257/E21.165 |
| 9,390,981 | B1 * | 7/2016 | Basker | H01L 21/823814 |
| 2008/0124878 | A1 * | 5/2008 | Cook | H01L 29/66621 438/300 |
| 2010/0035400 | A1 * | 2/2010 | Zhu | H01L 21/28061 438/300 |
| 2010/0301350 | A1 * | 12/2010 | Tamura | H01L 21/823807 257/77 |

(Continued)

*Primary Examiner* — Christine Enad
(74) *Attorney, Agent, or Firm* — Sterne, Kessler, Goldstein & Fox P.L.L.C.

(57) ABSTRACT

A method of forming a semiconductor device includes forming a fin on a substrate and forming a source/drain region on the fin. The method further includes forming a doped metal silicide layer on the source/drain region and forming a super-saturated doped interface between the doped metal silicide and the source/drain region. An example benefit includes reduction of contact resistance between metal silicide layers and source/drain regions.

20 Claims, 13 Drawing Sheets

(56) References Cited

U.S. PATENT DOCUMENTS

| | | | |
|---|---|---|---|
| 2011/0068396 A1* | 3/2011 | Cheng | H01L 29/165 |
| | | | 257/335 |
| 2012/0056245 A1* | 3/2012 | Kang | H01L 21/0245 |
| | | | 257/192 |
| 2012/0223372 A1* | 9/2012 | Alptekin | H01L 21/28518 |
| | | | 257/288 |
| 2013/0154026 A1* | 6/2013 | Alptekin | H01L 21/82342 |
| | | | 257/384 |
| 2013/0187228 A1* | 7/2013 | Xie | H01L 29/785 |
| | | | 257/347 |
| 2016/0111537 A1* | 4/2016 | Tsai | H01L 29/7848 |
| | | | 257/192 |
| 2016/0197075 A1* | 7/2016 | Li | H01L 27/0924 |
| | | | 257/369 |
| 2016/0197182 A1* | 7/2016 | Li | H01L 29/7833 |
| | | | 257/408 |

* cited by examiner

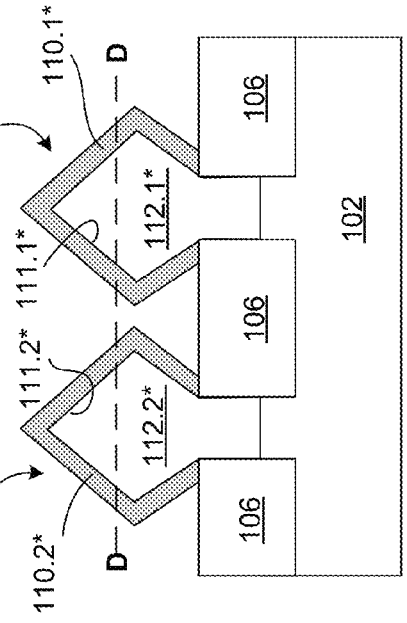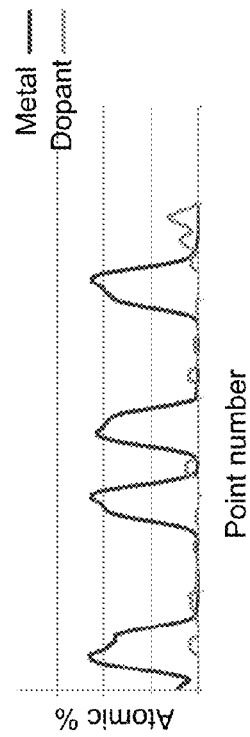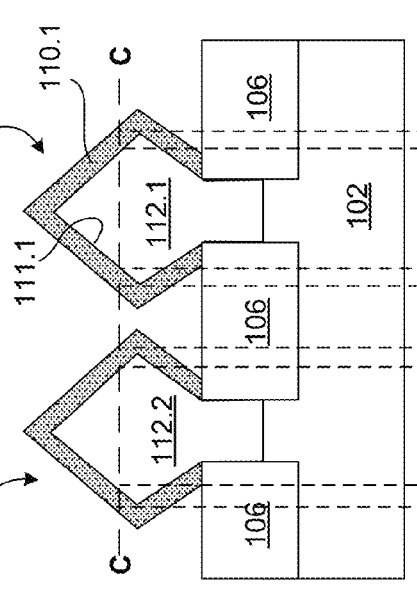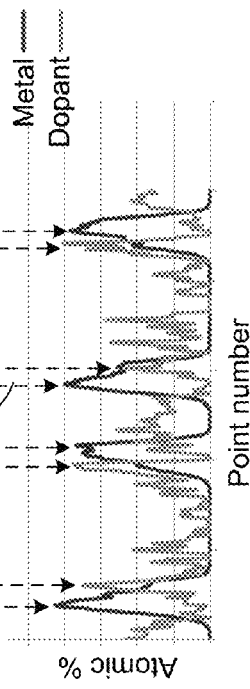

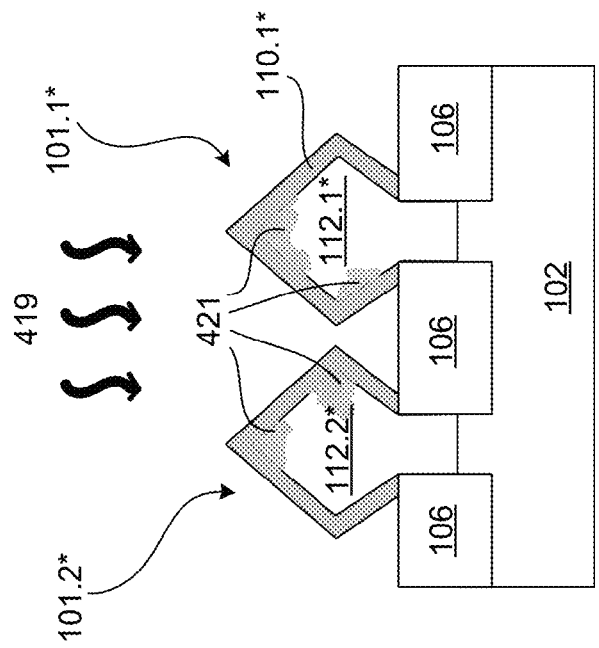
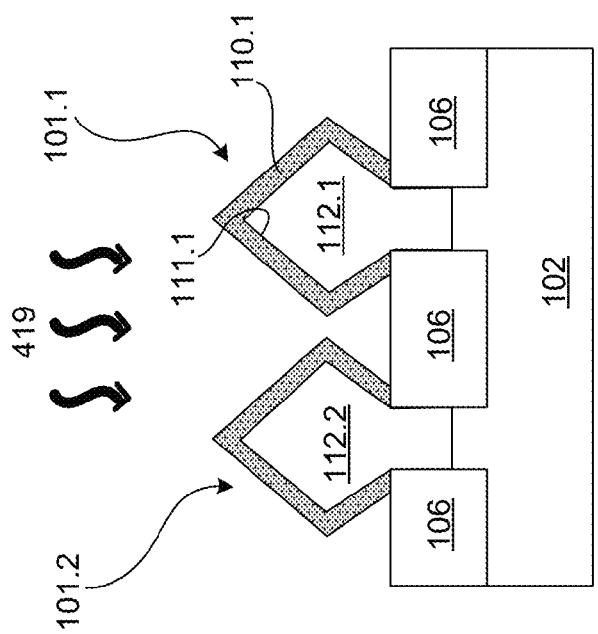
FIG. 4B
FIG. 4A

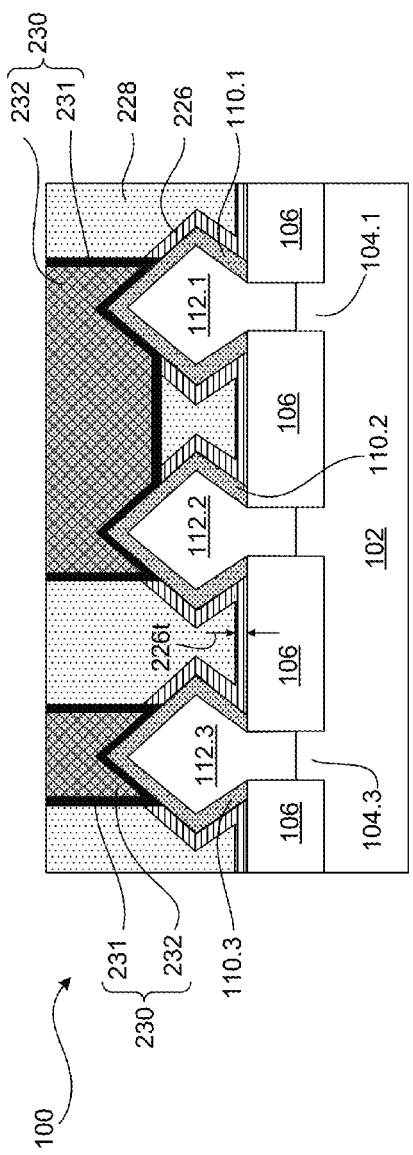
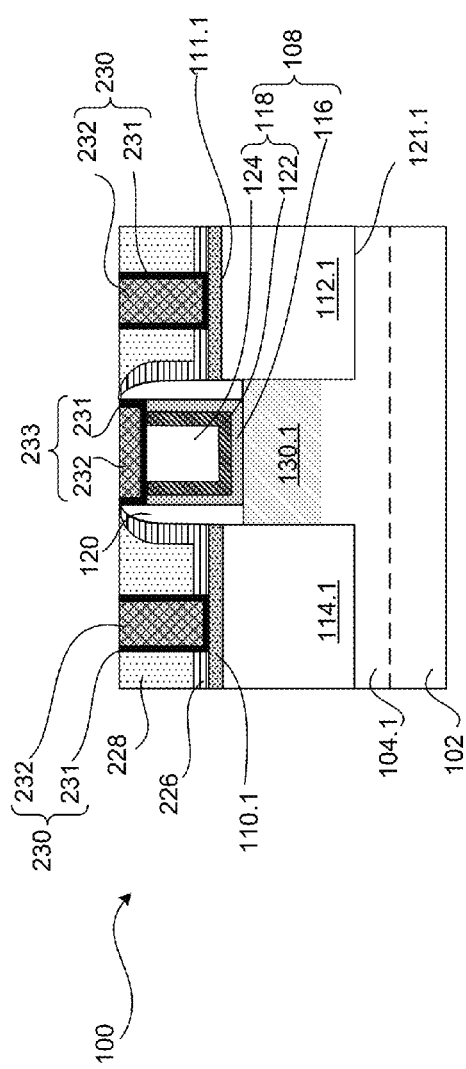

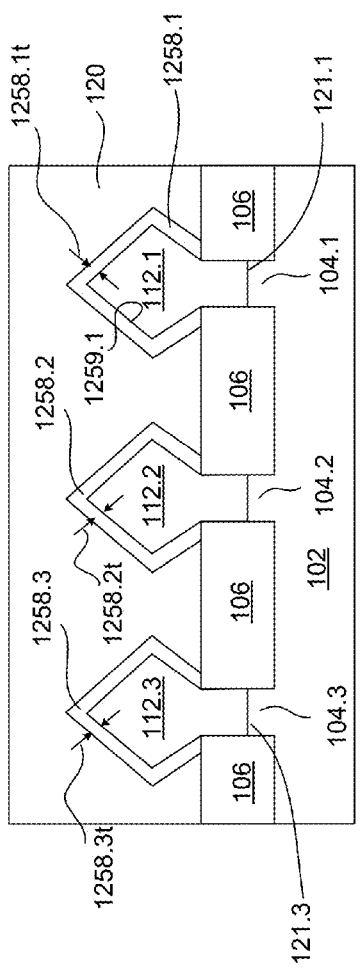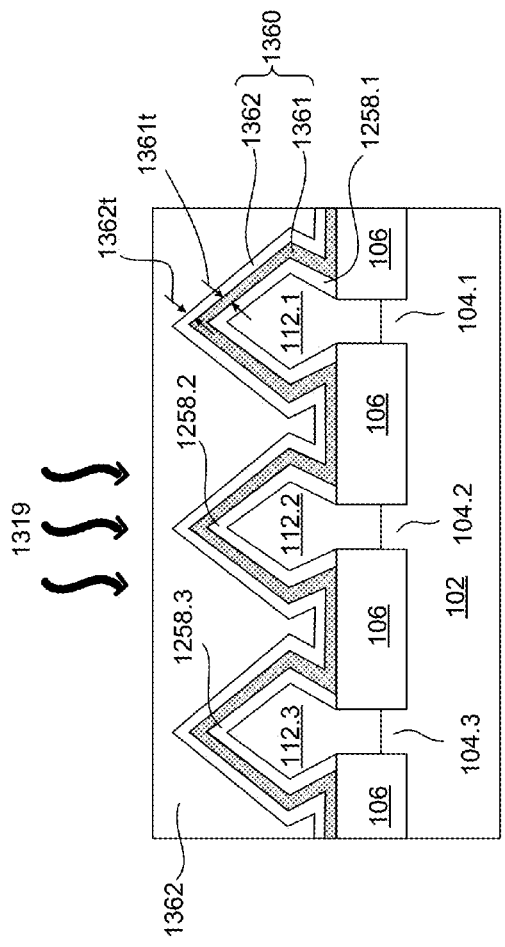

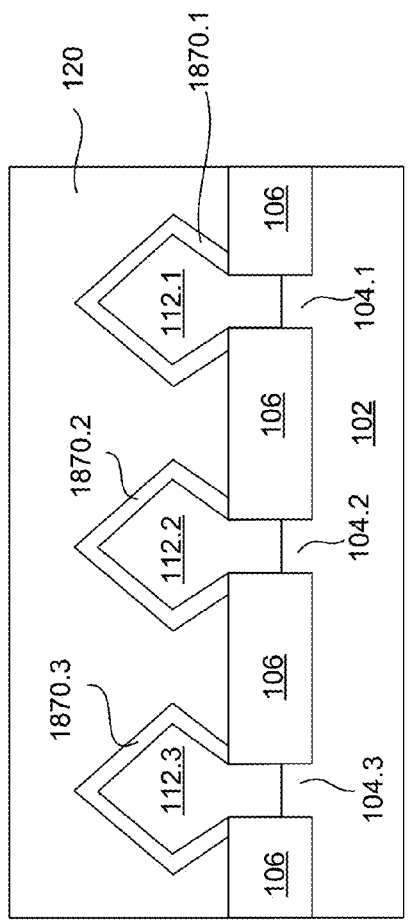
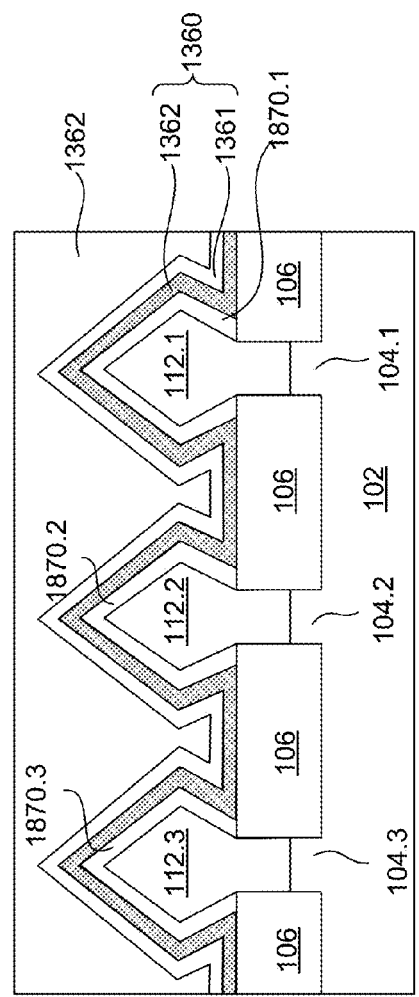
FIG. 18
FIG. 19

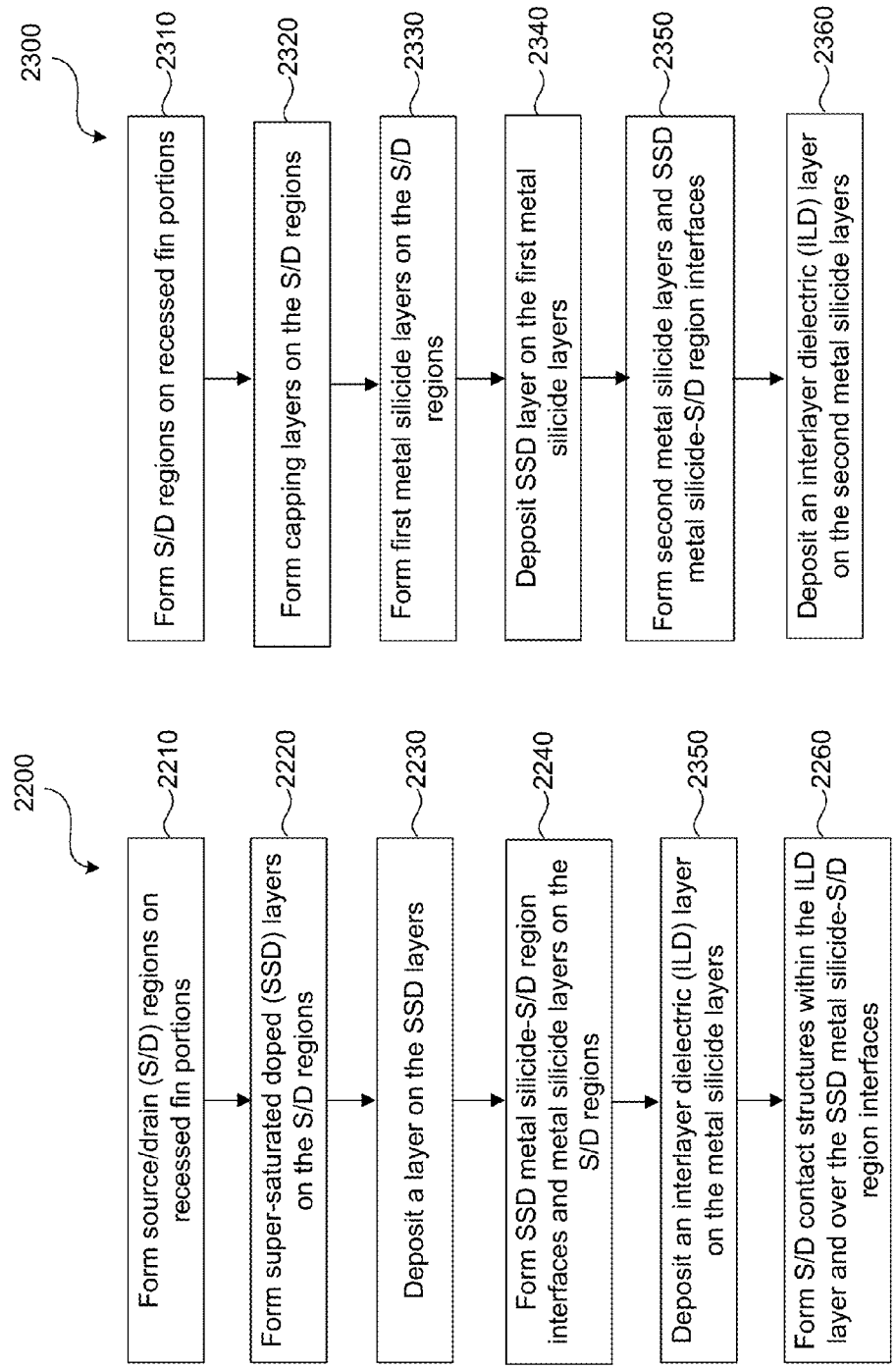

US 9,997,631 B2

1

METHODS FOR REDUCING CONTACT RESISTANCE IN SEMICONDUCTORS MANUFACTURING PROCESS

BACKGROUND

This disclosure generally relates to semiconductor devices and methods of fabricating the same.

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and finFETs.

Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIG. 2A is a cross-sectional view of an exemplary device having super-saturated doped interfaces.

FIG. 2B is an exemplary energy-dispersive spectroscopy (EDS) profile along line C-C of the exemplary device of FIG. 2A.

FIG. 3A is a cross-sectional view of an exemplary device without super-saturated doped interfaces.

FIG. 3B is an EDS profile along line D-D of the exemplary device of FIG. 3A.

FIG. 4A is a cross-sectional view of an exemplary high temperature (HT) treated device having super-saturated doped interfaces.

FIG. 4B is a cross-sectional view of an exemplary HT treated device without super-saturated doped interfaces.

FIGS. 5A-5B are cross-sectional views along respective lines A-A and B-B of the exemplary device of FIG. 1.

FIGS. 12-21 are cross-sectional views of a device at various stages of its exemplary fabrication process.

FIGS. 22-23 are flow diagrams of exemplary methods for fabricating a device.

Illustrative embodiments will now be described with reference to the accompanying drawings. In the drawings, like reference numerals generally indicate identical, functionally similar, and/or structurally similar elements.

DETAILED DESCRIPTION

Figure 1:
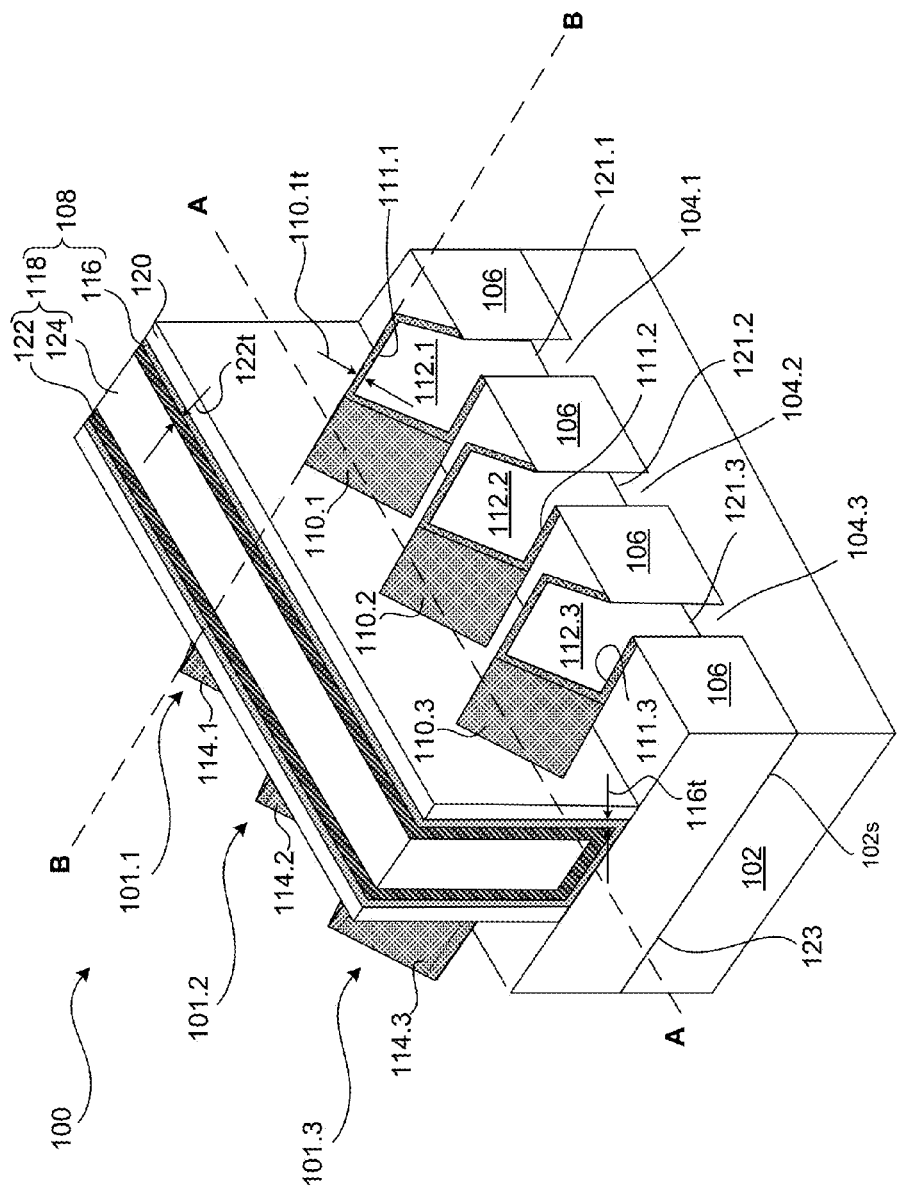
FIG. 1 is an isometric view of an exemplary device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

The term "about" as used herein indicates the value of a given quantity varies by ±10% of the value, or optionally ±5% of the value, or in some embodiments, by ±1% of the value so described. For example, "about 100 nm" encompasses a range from 90 nm to 110 nm, inclusive.

As used herein, the term "selectivity" refers to the ratio of the etch rates of two materials under the same etching conditions.

As used herein, the term "substrate" describes a material onto which subsequent material layers are added. The substrate itself may be patterned, and materials added on top of it may also be patterned, or may remain without patterning. Furthermore, "substrate" may be any of a wide array of semiconductor materials such as silicon, germanium, gallium arsenide, indium phosphide, etc. Alternatively, the substrate may be electrically non-conductive such as a glass or sapphire wafer.

As used herein, the term "high-k" refers to a high dielectric constant. In the field of semiconductor device structures and manufacturing processes, high-k refers to a dielectric constant that is greater than the dielectric constant of $SiO_2$ (i.e., greater than 3.9).

As used herein, the term "vertical" means nominally perpendicular to the surface of a substrate.

As used herein, the term "super-saturated dopant concentration" refers to a concentration of dopants in a medium or composition that is greater than the concentration of dopants required for the medium or composition to be saturated with the dopants. The term as used herein also refers to a concentration of dopants in a medium or composition that is greater than a solubility limit of the dopants in the medium or composition.

Overview

This disclosure provides various exemplary methods for reducing contact resistance between metal silicide layers and source/drain (S/D) regions in finFET devices.

An Exemplary FinFET

FIG. 1 is an isometric view of an exemplary device 100 taken after a gate replacement process. Device 100 may be included in a microprocessor, memory cell, or other integrated circuit (IC). Although FIG. 1 illustrates device 100, it is understood the IC may comprise any number of other devices including resistors, capacitors, inductors, fuses, etc. FIG. 1 is for illustrative purposes and is not drawn to scale.

Device 100 is formed on a substrate 102, and includes a plurality of finFETs 101.1 through 101.3, a plurality of shallow trench isolation (STI) regions 106, a gate structure 108 disposed on finFETs 101.1 through 101.3, and spacers 120. FinFETs 101.1 through 101.3 include fins 104.1 through 104.3, S/D regions 112.1 through 112.3 disposed on one side of gate structure 108, and S/D regions 114.1 through 114.3 disposed on an oposing side of gate structure 108, respectively. FinFETs 101.1 through 101.3 further include metal silicide layers 110.1 through 110.3 disposed on S/D regions 112.1 through 112.3 and 114.1 through 114.3, respectively. It is understood by those skilled in the relevant art(s) that the names "source" and "drain" can be interchangeable based on the voltage that is applied to those terminals when the transistor is operated. The isometric view of FIG. 1 is taken after formation of gate structure 108 in a gate replacement process. FIG. 1 shows one gate structure 108. However, there may be additional gate structure(s) (not shown) similar and parallel to gate structure 108. In addition, device 100 may be incorporated into an integrated circuit through the use of other structural components such as S/D contacts, gate contacts, vias, interconnect metal layers, dielectric layers, passivation layers, etc., that are omitted for the sake of clarity.

FinFETs 101.1 through 101.3 further include interfaces 121.1 through 121.3 between fins 104.1 through 104.3 and S/D regions 112.1 through 11.2.3, respectively. Device 100 includes an interface 123 between STI regions 106 and substrate 102. In some embodiments, one or more of interfaces 121.1 through 121.3 are coplanar with interface 123. In some embodiments, one or more of interfaces 121.1 through 121.3 are either above or below the level of interface 123. In some embodiments, one or more of interfaces 121.1 through 121.3 are coplanar with each other.

Although device 100 is shown in FIG. 1 as including three finFETs 101.1 through 101.3, device 100 may include any suitable number of finFETs as would be understood by a person of ordinary skill in the art(s). This suitable number can include a single finFET as well as multiple finFETs similar to those illustrated in FIG. 1. And although finFETs 101.1 through 101.3 are shown in FIG. 1 as each including one fin 104.1 through 104.3, respectively, finFETs 101.1 through 101.3 may each include any suitable number of fins as would be understood by a person of ordinary skill in the art(s). This suitable number can include a single fin as well as multiple fins similar to those illustrated in FIG. 1. It should be noted that cross-sectional shape of fins 104.1 through 104.3 shown in FIG. 1 is illustrative and is not intended to be limiting.

Substrate 102 is a physical material on which finFETs 101.1 through 101.3 are formed. Substrate 102 is a semiconductor material such as, but not limited to, silicon. In some embodiments, substrate 102 comprises a crystalline silicon substrate (e.g., wafer). In some embodiments, substrate 102 comprises another elementary semiconductor, such as germanium; a compound semiconductor including silicon carbide, gallium arsenide, gallium phosphide, indium phosphide, indium arsenide, indium antimonide; an alloy semiconductor including silicon germanium carbide, silicon germanium, gallium arsenic phosphide, gallium indium phosphide, gallium indium arsenide, gallium indium arsenic phosphide, aluminum indium arsenide, aluminum gallium arsenide; or combinations thereof. In some embodiments, substrate 102 includes an epitaxial layer (epi-layer), may be strained for performance enhancement, and/or includes a silicon-on-insulator (SOI) structure. Further, substrate 102 may be doped depending on design requirements (e.g., p-type substrate or n-type substrate). In some embodiments, substrate 102 may be doped with p-type dopants, such as boron, indium, aluminum, or gallium, or n-type dopants, such as phosphorus or arsenic. The doped substrate 102 may be configured for an n-type finFET, or alternatively configured for a p-type finFET.

STI regions 106 provide electrical isolation of finFETs 101.1 through 101.3 from each other and from neighboring active and passive elements (not illustrated in FIG. 1) integrated with or deposited onto substrate 102. STI regions 106 are made of dielectric material. In some embodiments, STI regions 106 include silicon oxide, silicon nitride, silicon oxynitride, fluorine-doped silicate glass (FSG), a low-k dielectric material, and/or other suitable insulating material. In some embodiments, STI regions 106 include a multi-layer structure.

Gate structure 108 traverses each of fins 104.1 through 104.3 and wraps around a portion of each of fins 104.1 through 104.3 defining the channel regions. Gate structure 108 includes a dielectric layer 116 and a gate electrode 118. In some embodiments, dielectric layer 116 is adjacent to and in contact with gate electrode 118. In some embodiments, a thickness $116t$ of dielectric layer 116 is in the range of about 1 nm to about 5 nm. Gate structure 108 may further include interfacial layers at interface between gate structure 108 and fins 104.1 through 104.3, capping layers, etch stop layers, and/or other suitable materials in various embodiments. The interfacial layers may include a dielectric material such as a silicon dioxide layer ($SiO_2$) or silicon oxynitride (SiON). The interfacial dielectric layers may be formed by chemical oxidation, thermal oxidation, atomic layer deposition (ALD), chemical vapor deposition (CVD), and/or other suitable formation processes. Gate structure 108 may be formed by a gate replacement process.

Dielectric layer 116 traverses each of fins 104.1 through 104.3 and wraps around a portion of each of fins 104.1 through 104.3. Dielectric layer 116 may include silicon oxide. Dielectric layer 116 may be formed by CVD, ALD, physical vapor deposition (PVD), e-beam evaporation, or other suitable process. In some embodiments, dielectric layer 116 includes one or more layers of silicon oxide, silicon nitride, silicon oxynitride, or high-k dielectric materials such as hafnium oxide ($HfO_2$), $TiO_2$, $HfZrO$, $Ta_2O_3$, $HfSiO_4$, $ZrO_2$, $ZrSiO_2$, or combinations thereof. Alternatively, high-k dielectric materials may comprise metal oxides. Examples of metal oxides used for high-k dielectrics include oxides of Li, Be, Mg, Ca, Sr, Sc, Y, Zr, Al, La, Ce, Pr, Nd, Sm, Eu, Gd, Tb, Dy, Ho, Er, Tm, Yb, Lu, and/or mixtures thereof. The high-k dielectric layer may be formed by ALD and/or other suitable methods. In some embodiments, dielectric layer 116 includes a single layer or a stack of insulating material layers. Spacers 120 are in contact with dielectric layer 116.

Gate electrode 118 may include a gate work function metal layer 122 and a gate metal fill layer 124. In some embodiments, gate work function metal layer 122 is disposed on dielectric layer 116. Gate work function metal layer 122 may include a single metal layer or a stack of metal layers. The stack of metal layers may include metals having work functions similar to or different from each other. In some embodiments, gate work function metal layer 122 includes any suitable material, such as aluminum (Al), copper (Cu), tungsten (W), titanium (Ti), tantulum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. Exemplary work function metal(s) that may be included in gate work function metal layer 122 in a p-type device include TiN, TaN, Ru, Mo, Al, WN, $ZrSi_2$, $MoSi_2$, $TaSi_2$, $NiSi_2$, WN, other suitable p-type work function metals, or combinations thereof. Exemplary work function metal(s) that may be included in work function metal layer 122 in an n-type device include Ti, Ag, TaAl, TaAlC, TiAlN, TaC, TaCN, TaSiN, Mn, Zr, other suitable n-type work function materials, or combinations thereof. Gate work function metal layer 122 may be formed using a suitable process such as ALD, CVD, PVD, plating, or combinations thereof. In some embodiments, a thickness 122t of gate work function metal layer 122 is in the range of about 2 nm to about 15 nm.

Gate metal fill layer 124 may include a single metal layer or a stack of metal layers. The stack of metal layers may include metals different from each other. In some embodiments, gate metal fill layer 124 includes any suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. Gate metal fill layer 124 may be formed by ALD, PVD, CVD, or other suitable conductive material deposition process.

Additionally or optionally, gate electrode 118 includes a gate metal liner (not shown) disposed on gate work function metal layer 122 in some embodiments. Gate metal liner may serve as a nucleation layer, which acts as a growth site for subsequent formation of gate metal fill layer 124. Gate metal liner may include any suitable metal such as W, Al, Co, Ti, Ag, Mn, Zr, Cu, Ni, and/or combinations thereof and may be formed by ALD, PVD, CVD, or other suitable metal deposition process. In some embodiments, gate metal liner has a thickness less than 10 nm.

For the sake of clarity, FIG. 1 will be further described with respect to finFET 101.1. FinFETs 101.1 through 101.3 are similar in structure and function with respect to each other and it should be understood that discussion of finFET 101.1 applies to finFETs 101.2 and 101.3 unless mentioned otherwise.

Fin 104.1 is the current carrying structure of finFET 101.1. Fin 104.1 includes a channel region (not shown in FIG. 1; a cross-sectional view of channel region 130.1 corresponding to fin 104.1 is shown in FIG. 5B). The channel region underlies gate structure 108 and is disposed between S/D regions 112.1 and 114.1. The channel region provides a conductive path between respective S/D regions 112.1 and 114.1 when a voltage applied to gate structure 108 turns on finFET 101.1.

S/D regions 112.1 and 114.1 are formed on fin 104.1. S/D regions 112.1 and 114.1 include epitaxially-grown semiconductor material on recessed portions of fin 104.1 on either side of gate structure 108. S/D regions 112.1 and 114.1 may include a single crystalline structure. In some embodiments, the epitaxially grown semiconductor material is the same material as the material of substrate 102. In some embodiments, the epitaxially-grown semiconductor material includes a different material from the material of substrate 102 and imparts a strain on the channel. Since the lattice constant of the strained semiconductor material is different from the material of substrate 102, channel regions are strained to advantageously increase carrier mobility in the channel region of finFET 104.1 and thereby enhance its performance. The epitaxially-grown semiconductor material may include elementary semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), or gallium arsenide phosphide (GaAsP). In an embodiment, the epitaxially-grown semiconductor material includes a high percentage of Ge compared to Si. In some embodiments, the epitaxially-grown semiconductor material includes Ge in a range from about 50 atomic percent to about 100 atomic percent with any remaining atomic percent being Si. In some embodiments, the epitaxially-grown semiconductor material includes Ge in a range from about 0 atomic percent to about 70 atomic percent with any remaining atomic percent being Si.

In some embodiments, the epitaxially-grown semiconductor material can be formed by CVD, e.g., low pressure CVD (LPCVD), atomic layer CVD (ALCVD), ultrahigh vacuum CVD (UHVCVD), reduced pressure CVD (RP-CVD), any suitable CVD; molecular beam epitaxy (MBE) processes; any suitable epitaxial process; or any combinations thereof. In some embodiments, the epitaxially-grown semiconductor material is formed by an epitaxial deposition/partial etch process, which repeats the epitaxial deposition/partial etch process at least once. Such repeated deposition/partial etch process is also called a cyclic deposition-etch (CDE) process.

Further, S/D regions 112.1 and 114.1 may be in-situ doped during the epitaxial growth. In various embodiments, the epitaxially-grown S/D regions 112.1 and 114.1 may be doped with p-type dopants, such as boron, indium, or gallium; n-type dopants, such as phosphorus or arsenic; and/or combinations thereof; epitaxially grown SiGe S/D regions 112.1 and 114.1 may be doped with p-type dopants, such as boron, gallium, or indium, n-type dopants, such as phosphorus or arsenic, and/or combinations thereof; epitaxially grown Si S/D regions 112.1 and 114.1 may be doped with carbon to form Si:C S/D regions 112.1 and 114.1, phosphorous to form Si:P S/D regions 112.1 and 114.1, or both carbon and phosphorous to form SiCP S/D regions 112.1 and 114.1. For p-type in-situ doping, p-type doping precursors, such as, but not limited to, diborane ($B_2H_6$), boron trifluoride ($BF_3$), and/or other p-type doping precursors can be used. For n-type in-situ doping, n-type doping precursors, such as, but not limited to, phosphine ($PH_3$), arsine ($AsH_3$), and/or other n-type doping precursor can be used. By using the in-situ doping process, the dopant concentration of the epitaxially-grown semiconductor material can be desirably controlled and achieved. In some embodiments, S/D regions 112.1 and 114.1 are not in-situ doped, and an ion implantation process is performed to dope S/D regions 112.1 and 114.1. In some embodiments, S/D regions 112.1 and 114.1 have a dopant concentration in a range from about 1E19 to about 1E21 atoms/cm$^3$.

Metal silicide layer 110.1 may be disposed on S/D regions 112.1 and 114.1 to wrap around (as shown in FIG. 1) or partially cover portions of S/D regions 112.1 and 114.1 protruding above top surface 106t of STI regions 106. In some embodiments, metal silicide layer 110.1 has a thickness 110.1t in a range from about 1 nm to about 5 nm. Metal silicide layer 110.1 provides a low resistance interface between S/D regions 112.1 and 114.1 and corresponding contact structure (not shown in FIG. 1; a cross-sectional view of contact structure 230 corresponding to S/D region 112.1 is shown in FIG. 5B). Metal silicide layer 110.1 includes Co, Ni, Ti, W, Mo, other refractory metals, or a combination thereof.

In some embodiments, metal silicide layer 110.1 is formed from a salicide process between a super-saturated doped (SSD) layer (e.g., SSD layer 1258.1 shown in FIG. 12) disposed on S/D regions 112.1 and 114.1 and a metal layer (e.g., metal layer 1360 shown in FIG. 13) disposed on the SSD layer. The metal layer reacts with the SSD layer during a thermal treatment to form metal silicide layer 110.1. Exemplary embodiments of forming metal silicide layer 110.1 are described below with reference to FIGS. 12-14 and 18-22. In some embodiments, metal silicide layer 110.1 includes a metal silicide-dopant complex material that may be formed from dopants included in the SSD layer during the salicidation process. In some embodiments, metal silicide layer 110.1 is doped during the salicidation process with dopants from the SSD layer and have a dopant concentration greater than 1E21 atoms/cm$^3$, greater than 1E22 atoms/cm$^3$, or greater than 1E23 atoms/cm$^3$. Examples of dopants in the SSD layer includes P, As, other n-type dopants, or a combination thereof for forming metal silicide layer 110.1 in n-type finFET 101.1; B, In, Ga, other p-type dopants, or a combination thereof for forming metal silicide layer 110.1 in p-type finFET 101.1.

The term "SSD layer" as used herein refers to a layer having a dopant concentration that is greater than a solubility limit of the dopant in the layer. For example, a Si-comprising SSD layer or a Ge-comprising SSD layer may have a B, P, As, In, or other dopant concentration greater than 1E22 atoms/cm$^3$ or greater than 1E23 atoms/cms$^3$. The SSD layer and S/D regions 112.1 and 114.1 may be epitaxially grown in-situ. The epitaxial growth of the SSD layer allows for substantially conformal growth of the SSD layer on S/D regions 112.1 and 114.1. The SSD layer may be amorphous or polycrystalline in structure. In some embodiments, the SSD layer may comprise material(s) similar to or different from S/D regions 112.1 and 114.1. In some embodiments, the SSD layer comprises Ge in a range from about 0 atomic percent to about 50 atomic percent with any remaining atomic percent being Si.

FinFET 101.1 further includes an SSD interface 111.1 between metal silicide layer 110.1 and S/D regions 112.1 and 114.1. SSD interface 111.1 includes a dopant concentration greater than 1E22 atoms/cm$^3$ or greater than 1E23 atoms/cms$^3$. Super-saturated doping of SSD interface 111.1 may be due to the pile-up of dopants from the SSD layer at SSD interface 111.1 during the exemplary salicide process. Also, as the SSD layer can be grown conformally on S/D regions 112.1 and 114.1, doping of metal silicide layer 110.1 and SSD interface 111.1 from dopants of the SSD layer during the salicide process is substantially uniform throughout. An exemplary salicide process is discussed below with reference to FIGS. 12-14 and 18-22. The super-saturated dopant concentration at SSD interface 111.1 allows for very small contact resistance (Rc) between metal silicide layer 110.1 and S/D regions 112.1 and 114.1. This Rc is also substantially uniform across areas between metal silicide layer 110.1 and S/D regions 112.1 and 114.1. In some embodiments, Rc is smaller than 1E-9 ohm/cm$^2$ or smaller than 1E-10 ohm/cm$^2$. Lowering Rc improves conductivity between S/D regions 112.1 and 114.1 and corresponding contact structures subsequently formed on metal silicide layer 110.1.

Typically, metal silicide layers in current finFETs are formed by a salicide process between a heavily doped Si-comprising region of S/D regions and a metal layer deposited on the doped Si-comprising region. Heavily doping the Si-comprising region typically involves a pre-amorphization implantation followed by an ion implantation. However, both these high energy implantations cause defects in the doped Si-comprising region, which adversely affect the contact resistance between metal silicide-S/D region interfaces of the current finFETs and it is difficult to achieve contact resistance smaller than 1E-9 ohm/cm$^2$. Also, the ion implantation is directional and as result, the doping achieved through these ion implantations is not uniform across the metal silicide layer and/or the metal silicide-S/D region interface. Consequently, contact resistance varies across areas between the metal silicide layers and the S/D regions of the current finFETs. Besides, the dopant concentration achieved through these ion implantations is lower than the super-saturated dopant concentration achieved in metal silicide layer 110.1 and/or SSD interface 111.1 as shown in FIGS. 2A-2B and 3A-3B.

FIG. 2A shows a cross-sectional view of finFETs 101.1 and 101.2 along line A-A of FIG. 1. For the sake of clarity, a portion of device 100 is shown in FIG. 2A. FIG. 2B shows an EDS profile of metal and dopant along line C-C of FIG. 2A. Arrows 215 indicate high metal concentration metal silicide 110.1 with respect to other areas along C-C on finFET 101.1. Arrows 217 indicate higher dopant concentration at SSD interface 111.1 with respect to other areas along line C-C on finFET 101.1. In comparison, EDS profile (FIG. 3B) of metal and dopant along line D-D on finFETs 101.1* and 101.2* (FIG. 3A) shows very low dopant concentration that is barely detectable by EDS. Formation of metal silicide layers 110.1* and 110.2* and interfaces 111.1* and 111.2* of FIG. 3A involved the pre-amorphization implantation and the ion implantation described above with reference to typical processing of current finFETs.

FIGS. 4A-4B illustrate another advantage of SSD interface 111.1 and heavily doped or SSD metal silicide layer 110.1. Similar to FIG. 2A, FIG. 4A shows a portion of device 100 that is subjected to a high-temperature (e.g., temperature greater than 850° C. or greater than 900° C.) thermal treatment 419. The presence of super-saturated dopant concentration at SSD interface 111.1 and/or in metal silicide layer 110.1 provides thermal stability to SSD interface 111.1 and/or metal silicide layer 110.1 and prevents substantial agglomeration of metal silicide layer 110.1.

In comparison, metal silicide layers 110.1* and 110.2* of finFETs 101.1* and 101.2* (FIG. 4B) without super-saturated dopant concentration agglomerate when finFETs 101.1* and 101.2* are subjected to high-temperature thermal treatment 419. Metal silicide layers 110.1* and 110.2* and interfaces 111.1* and 111.2* are formed using the pre-amorphization implantation and the ion implantation described above. Agglomeration of metal silicide layers 110.1* and 110.2* tend to form masses or clusters of silicides 421 within metal silicide layers 110.1* and 110.2* and/or interfaces 111.1* and 111.2*. These agglomerates or masses or clusters of silicides 421 increase the contact resistance between metal silicide layers 110.1\* and 110.2\* and S/D regions 112.1\* and 112.2\*, respectively. Such agglomeration of metal silicide layers in current finFETs are problematic for subsequent high temperature processing of the finFETs post-metal silicide layer formation. Thus, in order to achieve Rc between metal silicide layers and S/D regions smaller than 1E-9 ohm/cm$^2$ and thermal stability of metal silicide layers at high temperatures, heavily doped or SSD metal silicide layers (e.g., metal silicide layers 110.1 through 110.3) and SSD interfaces (e.g., metal silicide layers 111.1 through 111.3) are described with reference to FIG. 1.

FIGS. 5A-5B are cross-sectional views of device 100 along lines A-A and B-B, respectively, in FIG. 1. It should be noted that the exemplary illustration of device 100 in FIG. 1 and the exemplary illustrations of device 100 along lines A-A and B-B in FIGS. 5A-5B may not be to scale. Those skilled in the relevant art will recognize that FIGS. 5A-5B are intended to describe additional structures of device 100 as well as further describe those structures of device 100 that are illustrated in FIG. 1. Those skilled in the relevant art will additionally recognize that device 100 need not include all of the additional structures of device 100 as illustrated in FIGS. 5A-5B without departing from the spirit and scope of this disclosure. Rather, different structures, configurations, and arrangements, as well as different configurations and arrangements for the structures described in FIGS. 1 and 5A-5B are possible for device 100.

The cross-sectional views of FIGS. 5A-5B are taken after formation of etch stop layer 226, interlayer dielectric (ILD) layer 228, S/D contact structures 230, and gate contact structure 233 post-formation of metal silicide layers 110.1 through 110.3 on S/D regions 112.1 through 112.3 and 114.1 through 114.3, respectively. Etch stop layer 226 is disposed on metal silicide layers 110.1 through 110.3 and on sides of spacers 120. Etch stop layer 226 may be used as a mask layer and a protective layer to protect metal silicide layers 110.1 through 110.3 and/or S/D regions 112.1 through 112.3 and 114.1 through 114.3 during formation of S/D contact structures 230. In some embodiments, etch stop layer 226 is formed of materials including, but not limited to, SiNx, SiOx, SiON, SiC, SiCN, BN, SiBN, SiCBN, and combinations thereof. Etch stop layer 226 may be formed using plasma enhanced chemical vapor deposition (PECVD), sub atmospheric chemical vapor deposition (SACVD), low pressure chemical vapor deposition (LPCVD), ALD, high-density plasma (HDP), plasma enhanced atomic layer deposition (PEALD), molecular layer deposition (MLD), plasma impulse chemical vapor deposition (PICVD), or other suitable deposition methods. In some embodiments, etch stop layer 226 includes a silicon nitride or a silicon oxide formed by LPCVD, PECVD, or CVD, or a silicon oxide formed by HARP. In some embodiments, etch stop layer 226 has a thickness 226t in a range of about 20 nm to 200 nm. In another embodiment, etch stop layer 226 has a thickness 226t in a range of about 20 nm to about 100 nm.

ILD layer 228 is disposed on etch stop layer 226. ILD layer 228 may include a dielectric material. The dielectric material of ILD layer 228 may be deposited using any deposition methods suitable for flowable dielectric materials (e.g., flowable silicon oxide, flowable silicon nitride, flowable silicon oxynitride, flowable silicon carbide, or flowable silicon oxycarbide). For example, flowable silicon oxide may be deposited for ILD layer 228 using flowable CVD (FCVD). In an embodiment, the dielectric material is silicon oxide.

S/D contact structures 230 are disposed on metal silicide layers 110.1 through 110.3 and within etch stop layer 226 and ILD layer 228. As shown in FIG. 5A, one of S/D contact structures 230 can be disposed on one S/D region such as S/D region 112.3 and/or one of S/D contact structures 230 can be disposed on two S/D regions such as S/D regions 112.1 and 112.2. Gate contact structure 233 and S/D contact structures 230 are configured to provide signals to gate structure 108 and S/D regions 112.1 through 112.3 and 114.1 through 114.3, respectively. Each of gate contact structure 233 and S/D contact structures 230 includes a diffusion barrier layer 231 and a conductive layer 232. In some embodiments, diffusion barriers 231 include a single layer or a stack of conductive materials such as, but not limited to, TiN, Ti, or Ni. In some embodiments, diffusion barrier layer 231 may also act at least one of the group consisting of an adhesion-promoting-layer, a glue-layer, a primer-layer, a protective-layer, and a nucleation-layer. In some embodiments, conductive layers 232 include conductive material such as W, Al, Co, or Cu.

An Example Method For Fabricating a Device

FIGS. 6-11 are isometric views of device 100 (as illustrated in FIGS. 1 and 5A-5B) at various stages of its exemplary fabrication. FIGS. 12-21 are cross-sectional views along line A-A of device 100 of FIGS. 1 and 11 at various stages of its exemplary fabrication.

Figure 6:
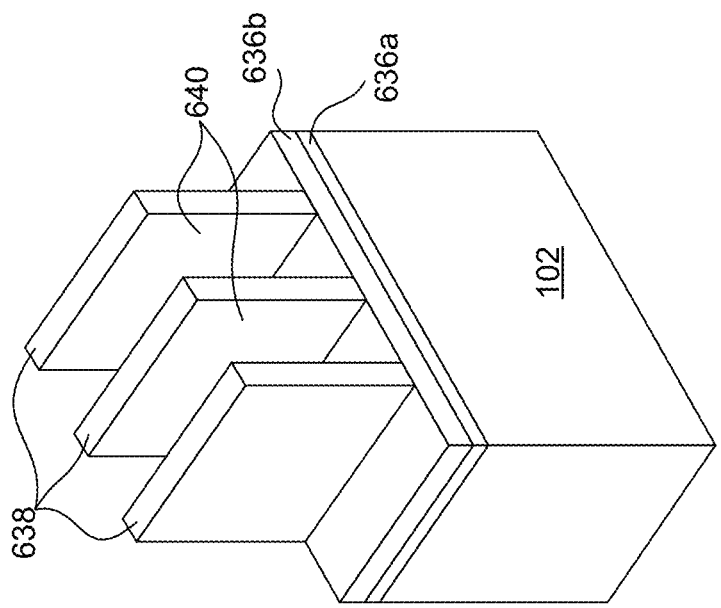

FIG. 6 is an isometric view of a partially fabricated device 100 after patterning of photoresist on substrate 102 for formation of fins 104.1 through 104.3. Fins 104.1 through 104.3 are formed by etching into substrate 102. A pad layer 636a and a mask layer 636b are formed on substrate 102. Pad layer 636a may be a thin film comprising silicon oxide formed, for example, using a thermal oxidation process. Pad layer 636a may act as an adhesion layer between substrate 102 and mask layer 636b. Pad layer 636a may also act as an etch stop layer for etching mask layer 636b. In an embodiment, mask layer 636b is formed of silicon nitride, for example, using low pressure chemical vapor deposition (LPCVD) or plasma enhanced CVD (PECVD). Mask layer 636b is used as a hard mask during subsequent photolithography processes. A photoresist layer 638 is formed on mask layer 636b and is then patterned, forming openings 640 in photo-sensitive layer 638.

Figure 7:
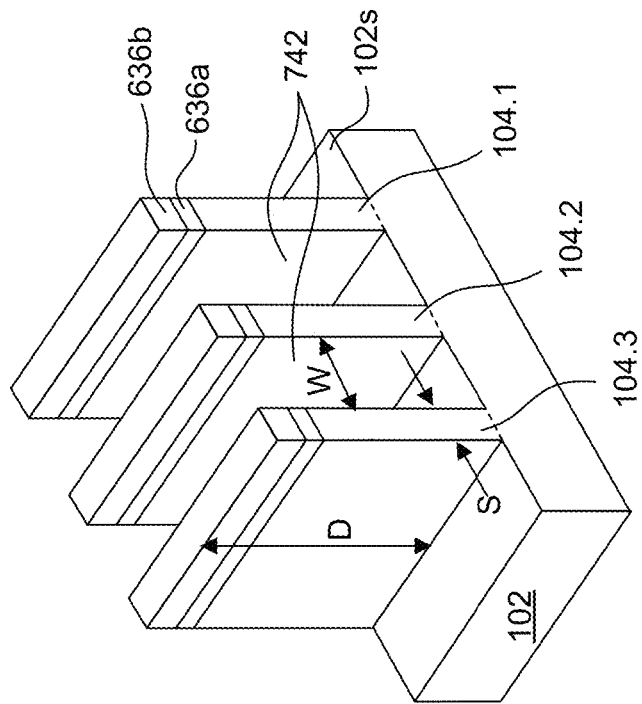
FIGS. 6-11 are isometric views of a device at various stages of its exemplary fabrication process.

FIG. 7 is an isometric view of a partially fabricated device 100 after the exemplary formation of fins 104.1 through 104.3. Hard mask layer 636b and pad layer 636a are etched through openings 640 to expose underlying substrate 102. The exposed substrate 102 is then etched to form trenches 742 with top surfaces 102s of substrate 102. Portions of substrate 102 between trenches 742 form fins 104.1 through 104.3. Patterned photoresist 638 is then removed. Next, a cleaning may be performed to remove a native oxide of substrate 102. The cleaning may be performed using diluted hydrofluoric (DHF) acid. In some embodiments, trenches 742 are spaced apart from adjacent trenches by a spacing S (i.e., fin widths) smaller than about 30 nm and depth D of trenches 742 ranges from about 210 nm to about 250 nm while width W (i.e., fin spacing) of trenches 742 is less than 50 nm. In some embodiments, the aspect ratio (D/W) of trenches 742 is greater than about 7.0. In other embodiments, the aspect ratio may even be greater than about 8.0. In yet other embodiments, the aspect ratio is lower than about 7.0.

Figure 8:
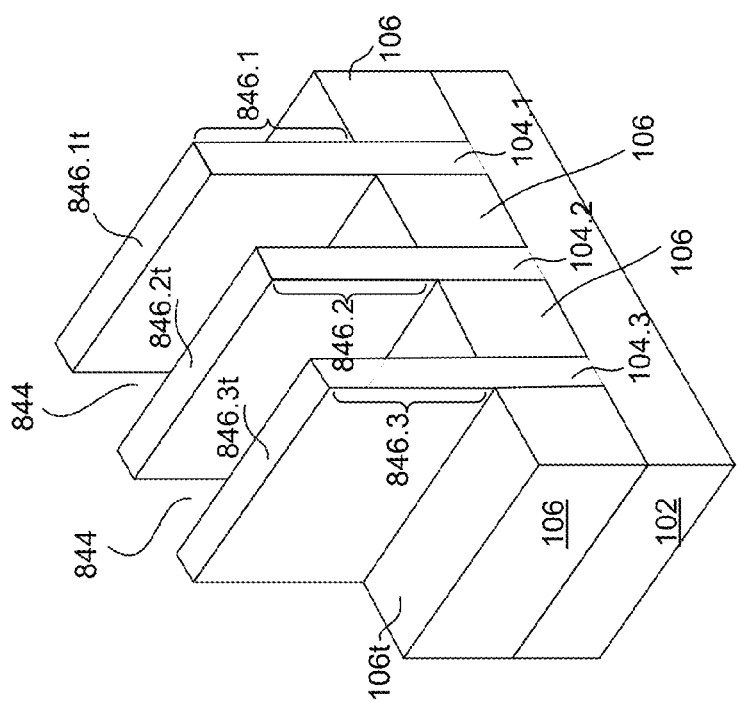

FIG. 8 is an isometric view of a partially fabricated device 100 after the exemplary formation of STI regions 106. The formation of STI regions 106 involves deposition and etching of a dielectric material. Trenches 844 are filled with a dielectric material. The dielectric material may include silicon oxide. In some embodiments, other dielectric materials, such as silicon nitride, silicon oxynitride, fluoride-doped silicate glass (FSG), or a low-k dielectric material, may also be used. In some embodiments, the dielectric material may be formed using a flowable CVD (FCVD) process, a high-density-plasma (HDP) CVD process, using silane ($SiH_4$) and oxygen ($O_2$) as reacting precursors. In other embodiments, the dielectric material may be formed using a sub-atmospheric CVD (SACVD) process or high aspect-ratio process (HARP), wherein process gases may comprise tetraethoxysilane (TEOS) and/or ozone ($O_3$). In yet other embodiments, the dielectric material may be formed using a spin-on-dielectric (SOD) such as hydrogen silsesquioxane (HSQ) or methyl silsesquioxane (MSQ).

A chemical mechanical polishing or a wet etching is then performed to remove hardmask layer 636b and pad layer 636a. This removal is followed by an etching of the dielectric material to form STI regions 106 and recessed regions 844 as shown in FIG. 8. Etching the dielectric material may be performed using a wet etching process, for example, by dipping substrate 102 in hydrofluoric acid (HF). Alternatively, the etching operation may be performed using a dry etching process, for example, using $CHF_3$ or $BF_3$ as etching gases. Upper fin portions 846.1 through 846.3 of fins 104.1 through 104.3, respectively, protruding over flat top surfaces 106t of STI regions 106 are used to form channel regions of finFETs 101.1 through 101.3, respectively. Upper fin portions 846.1 through 846.3 may comprise top surfaces 846.1t through 846.3t, respectively. In some embodiments, flat top surfaces 106t of STI regions 106 are lower than top surfaces 846.1t through 846.3t. In some embodiments, a vertical dimension of each of the upper fin portions 846.1 through 846.3 ranges from about 15 nm to about 50 nm. In another embodiment, a vertical dimension of each of the upper fin portions 846.1 through 846.3 ranges from about 20 nm to about 40 nm. In another embodiment, a vertical dimension of each of the upper fin portions 846.1 through 846.3 ranges from about 25 nm to about 35 nm.

Figure 9:
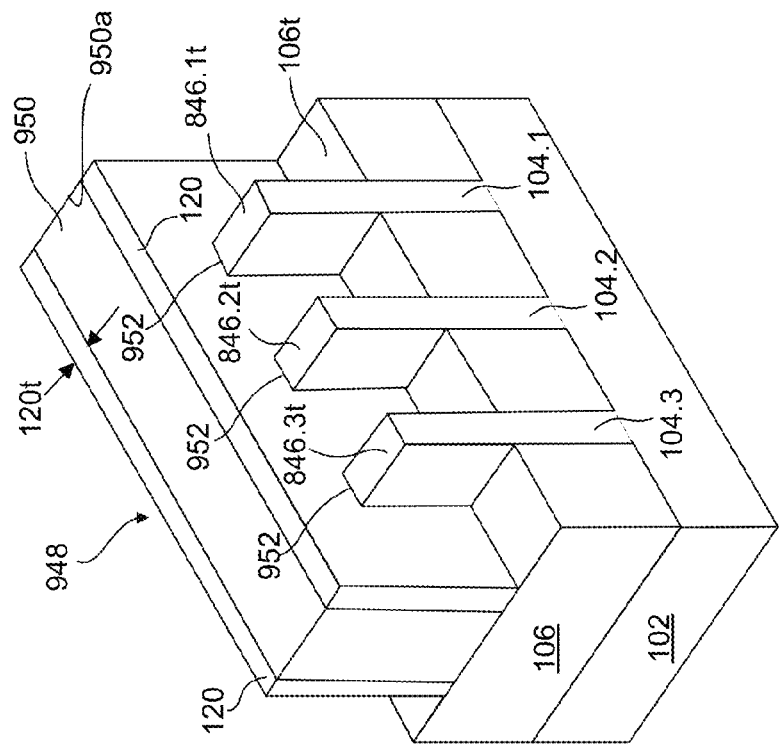

FIG. 9 is an isometric view of a partially fabricated device 100 after the exemplary formation of a structure 948 on fins 104.1 through 104.3 and STI regions 106. Structure 948 includes a patterned polysilicon structure 950 and spacers 120. Patterned polysilicon structure 950 and spacers 120 are formed over top surfaces 106t of STI regions 106 and over top surfaces 846.1t through 846.3t to wrap around upper fin portions 846.1 through 846.3. Interfaces 952 are formed between upper fin portions 846.1 through 846.3 and patterned polysilicon structure 950 and spacers 120. Patterned polysilicon structure 950 is formed by any suitable process. For example, patterned polysilicon structure 950 can be formed by a process including deposition, photolithography, and etching. Deposition processes include CVD, PVD, ALD, other suitable methods, and/or combinations thereof. Photolithography includes photoresist coating (e.g., spin-on coating), soft baking, mask aligning, exposure, post-exposure baking, developing the photoresist, rinsing, drying (e.g., hard baking), other suitable processes, and/or combinations thereof. Etching processes include dry etching, wet etching, and/or other etching methods (e.g., reactive ion etching). Spacers 120 may include dielectric material such as silicon oxide, silicon carbide, silicon nitride, silicon oxy-nitride, or other suitable material. Spacers 120 may comprise a single layer or multilayer structure. A blanket layer of a dielectric material may be formed over patterned polysilicon structure 950 by CVD, PVD, ALD, or other suitable technique followed by an anisotropic etching of the dielectric material to form spacers 120 on two sides of patterned polysilicon structure 950. Each of spacers 120 has a thickness 120t in a range from about 5 nm to about 15 nm.

Figure 10:
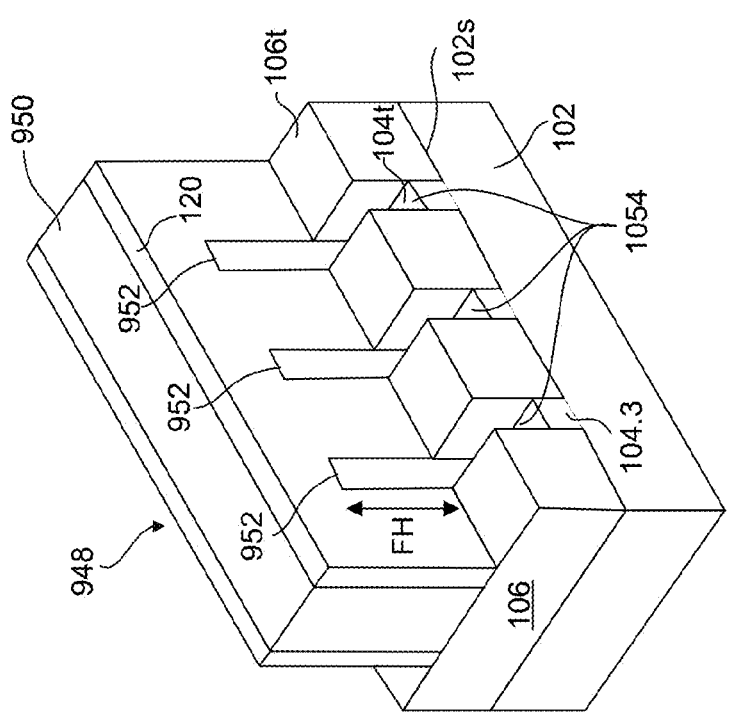

FIG. 10 is an isometric view of a partially fabricated device 100 after the exemplary formation of recessed fin portions 1054 of fins 104.1 through 104.3. The portions of fins 104.1 through 104.3 that are not covered by structure 948 are recessed to form recessed fin portions 1054 of fins 104.1 through 104.3 having surfaces 104t. In an embodiment, surfaces 104t of recessed fin portions 1054 are below the flat top surfaces 106t of STI regions 106. In alternative embodiments, the portions of fins 104.1 through 104.3 that are not covered by structure 948 are recessed to expose top surface 102s of substrate 102. In one embodiment, using spacers 120 as masks, a biased etching process is performed to form recessed fin portions 1054. The etching process may be performed under a pressure of about 1 mTorr to about 1000 mTorr, a power of about 50 W to about 1000 W, a bias voltage of about 20 V to about 500 V, at a temperature of about 40° C. to about 60° C., and using a HBr and/or $Cl_2$ as etch gases. Also, the bias voltage used in the etching process may be tuned to allow better control of an etching direction to achieve desired profiles for recessed fin portions 1054.

Figure 11:
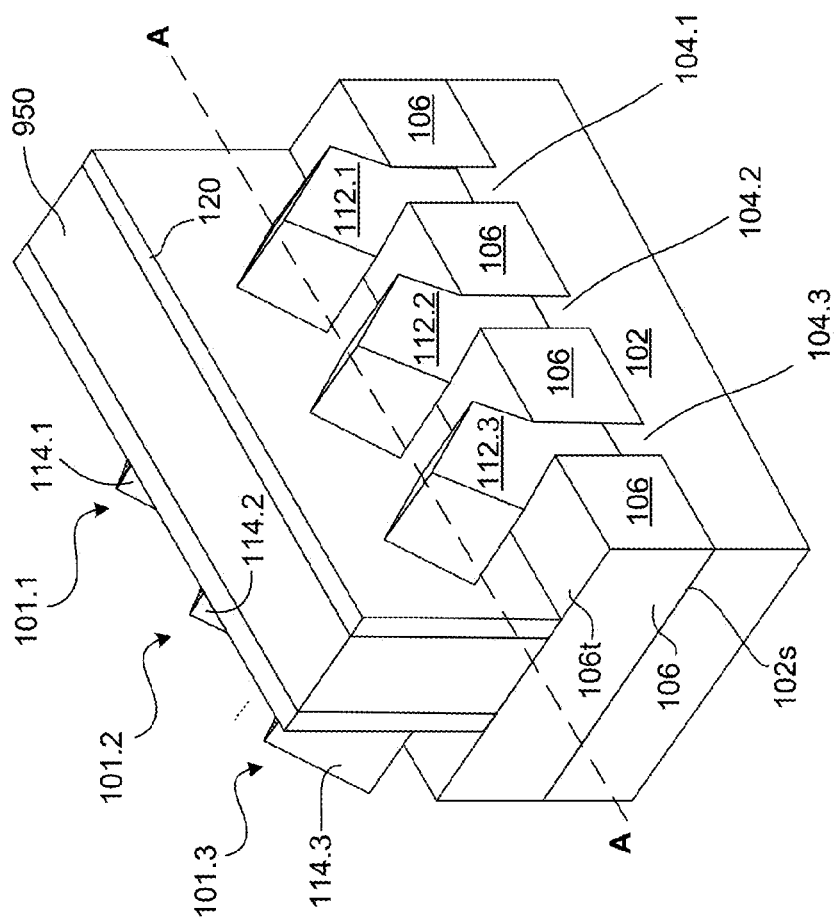

FIG. 11 is an isometric view of a partially fabricated device 100 after the exemplary formation of S/D regions 112.1 through 112.3 and 114.1 through 114.3 on recessed fin portions 1054 of fins 104.1 through 104.3. S/D regions 112.1 through 112.3 and 114.1 through 114.3 include epitaxially-grown semiconductor material on recessed portions 1054 of fins 104.1 through 104.3. In some embodiments, the epitaxially-grown semiconductor material is formed by an epitaxial deposition/partial etch process, which repeats the epitaxial deposition/partial etch process at least once. Such repeated deposition/partial etch process is also called a cyclic deposition-etch (CDE) process.

Semiconductor material of S/D regions 112.1 through 112.3 and 114.1 through 114.3 is selectively epitaxially-grown over recessed portions 1054. In some embodiments, the selective epitaxial growth of the semiconductor material of S/D regions 112.1 through 112.3 and 114.1 through 114.3 continues until the semiconductor material extends vertically a distance in a range from about 10 nm to about 100 nm above top surface 102s of substrate 102 and extends laterally over top surfaces 106t of some of STI regions 106. The semiconductor material includes element semiconductor material such as Ge or Si; or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial processes for growing the semiconductor material may include CVD deposition (e.g., LPCVD, vapor-phase epitaxy (VPE) and/or ultra-high vacuum CVD (UHV-CVD)), molecular beam epitaxy, and/or other suitable processes. In some embodiments, the semiconductor material, such as silicon carbon (SiC), is epi-grown by a LPCVD process to form the S/D regions 112.1 through 112.3 and 114.1 through 114.3 of an n-type finFETs 101.1 through 101.3, respectively. The LPCVD process is performed at a temperature of about 400° C. to about 800° C. and under a pressure of about 1 Torr to about 200 Torr, using $Si_3H_8$ as a precursor. In another embodiment, the semiconductor material, such as silicon germanium (SiGe), is epi-grown by a LPCVD process to form S/D regions 112.1 through 112.3 and 114.1 through 114.3 of a p-type finFETs 101.1 through 101.3, respectively. The LPCVD process is performed at a temperature of about 400° C. to about 800° C. and under a pressure of about 1 Torr to about 200 Torr, using SiH$_4$ and GeH$_4$ as precursors.

S/D regions 112.1 through 112.3 and 114.1 through 114.3 may be in-situ doped during the epitaxial growth of the semiconductor material. In various embodiments, the epitaxially grown S/D regions 112.1 and 114.1 may be doped with p-type dopants, such as B, In, Ga, or other p-type dopants; n-type dopants, such as P, As, or other n-type dopants; and/or combinations thereof. In some embodiments, epitaxially grown SiGe S/D regions 112.1 through 112.3 and 114.1 through 114.3 may be doped with p-type dopants, such as B, In, Ga, or other p-type dopants; n-type dopants, such as P, As, or other n-type dopants; and/or combinations thereof. In some embodiments, epitaxially grown Si S/D regions 112.1 through 112.3 and 114.1 through 114.3 may be doped with carbon to form Si:C S/D features, phosphorous to form Si:P S/D features, or both carbon and phosphorous to form SiCP S/D features. In one embodiment, S/D regions 112.1 through 112.3 and 114.1 through 114.3 are not in-situ doped, and ion implantation is used to dope S/D regions 112.1 through 112.3 and 114.1 through 114.3. One or more annealing processes may be performed to activate S/D regions 112.1 through 112.3 and 114.1 through 114.3. Annealing processes include but are not limited to rapid thermal annealing (RTA) and/or laser annealing.

FIG. 12 is a cross-sectional view of the structure of FIG. 11 along line A-A after exemplary formation of a super-saturated doped (SSD) layers 1258.1 through 1258.3 on S/D regions S/D regions 112.1 through 112.3, respectively. Similar SSD layers are also grown on S/D regions 114.1 through 114.3 (not shown in FIG. 12). As shown in FIG. 12, SSD layers 1258.1 through 1258.3 may wrap around portions of S/D regions 112.1 through 112.3, respectively, that are protruding over STI regions 106. SSD layers 1258.1 through 1258.3 may be selectively epitaxially-grown or deposited on S/D regions 112.1 through 112.3, respectively. In some embodiments, SSD layers 1258.1 through 1258.3 and S/D regions 112.1 through 112.3 are grown in-situ using an epitaxial deposition process. The epitaxial processes for growing SSD layers 1258.1 through 1258.3 may include CVD deposition (e.g., LPCVD, VPE and/or UHV-CVD), MBE, and/or other suitable processes. In some embodiments, SSD layers 1258.1 through 1258.3 and S/D regions 112.1 through 112.3 are grown using different deposition processes. In some embodiments, SSD layers 1258.1 through 1258.3 are conformally deposited on S/D regions 112.1 through 112.3, respectively, using, for example, a CVD process.

SSD layers 1258.1 through 1258.3 are amorphous or polycrystalline in structure and include a semiconductor material. Examples of the semiconductor material include Ge, Si, GaAs, AlGaAs, SiGe, GaAsP, or a combination thereof. In some embodiments, Si- and Ge-comprising SSD layers 1258.1 through 1258.3 may be epitaxially grown in a CVD process using precursors such as GeH$_4$, B$_2$H$_6$, dichlorosilane, SiH$_4$, or a combination thereof. The pressure and temperature in CVD growth chamber may be in a range from about 10 Torr to about 760 Torr and about 300° C. to about 800° C., respectively. SSD layers 1258.1 through 1258.3 may comprise Ge in a range from about 0 atomic percent to about 50 atomic percent with any remaining atomic percent being Si. Depending on thicknesses 1258.1$t$ through 1258.3$t$ of SSD layers 1258.1 through 1258.3, respectively, growth time may be in a range from about 100 sec to about 10 min. In some embodiments, thicknesses 1258.1$t$ through 1258.3$t$ is in a range from about 1 nm to about 10 nm. SSD layers 1258.1 through 1258.3 may be in-situ super-saturated doped in the CVD growth chamber during the epitaxial process using p-type or n-type doping precursors such as, but not limited to, B$_2$H$_6$, BF$_3$ for p-type super-saturated doping; PH$_3$, AsH$_3$ for n-type super saturated doping. In some embodiments, SSD layers 1258.1 through 1258.3 are in-situ doped to have a super-saturated dopant concentration of B, P, In, Ga, As, or other dopants that is greater than 1E21 atoms/cm$^3$, 1E22 atoms/cm$^3$, or 1E23 atoms/cm$^3$.

FIG. 13 is a cross-sectional view of the structure of FIG. 12 after deposition of a layer 1360 on SSD layers 1258.1 through 1258.3 and thermal treatment of layer 1360. Layer 1360 may include a single layer 1361 or a stack of layers such as layers 1360 and 1362. Layer 1361 may include a metal such as, but not limited to, Co, Ni, Ti, W, Mo, other refractory metals, or a combination thereof that in subsequent steps forms metal silicide layers by reacting with SSD layer 1258.1 through 1258.3 as described below with reference to FIG. 14. Layer 1362 may include nitride materials such as TiN and may act as a protective layer for layer 1361 during a salicide process between layer 1361 and SSD layers 1258.1 through 1258.3. Layer 1360 may be deposited using any suitable deposition process, such as, but not limited to, CVD, PECVD, or ALD. In some embodiments, layer 1361 has a thickness 1361$t$ in a range from about 1 nm to about 3 nm. In some embodiments, layer 1362 has a thickness 1362$t$ in a range from about 1 nm to about 10 nm.

Prior to deposition of layer 1360, native oxide from top surfaces of SSD layers 1258.1 through 1258.3 may be etched using HF and NH$_3$ gases at a flow rate between 1 sccm to about 50 sccm. During etching, a pressure and temperature in an etching chamber may be maintained in the range from about 0.1 Torr to about 0.5 Torr and from about 20° C. to about 80° C., respectively. The etching may be followed by an in-situ heat treatment with N$_2$ gas flowing at a rate of about 1 slm to about 5 slm and a pressure and temperature in the etching chamber maintained in the range from about 0.1 Torr to about 1 Torr and from about 150° C. to about 200° C., respectively.

In some embodiments, a Ti/TiN-comprising layer 1360 is deposited using precursors TiCl$_4$ or tetrakis(dimethylamino) titanium (TDMAT) in a PECVD process to first deposit Ti-comprising layer 1361 on SSD layer 1258.1 through 1258.3. Ti-comprising layer 1361 deposition is followed by a CVD process using TDMAT precursor flowing at a rate between 10 mgm to 100 mgm to deposit TiN-comprising layer 1362 on Ti-comprising layer 1361. The pressure and temperature in a CVD chamber during the deposition of TiN-comprising layer 1362 is maintained in a range from about 1 Torr to about 50 Torr and from about 350° C. to about 500° C., respectively.

In some embodiments, a Ti/TiN-comprising layer 1360 is deposited using gases TiCl$_4$ gas flowing at a rate between 10 sccm and 200 sccm and H$_2$ gas flowing at a rate between 10 sccm and 100 sccm in a CVD process to first deposit Ti-comprising layer 1361 on SSD layer 1258.1 through 1258.3. The pressure and temperature in a CVD chamber during the deposition of Ti-comprising layer 1361 is maintained in a range from about 1 Torr to about 10 Torr and from about 400° C. to about 500° C., respectively. Ti-comprising layer 1361 deposition is followed by an ALD process using TiCl$_4$ gas flowing at a rate between 10 sccm and 200 sccm and NH$_3$ gas flowing at a rate between 100 sccm and 10000 sccm to deposit TiN-comprising layer 1362 on Ti-comprising layer 1361. The pressure and temperature in an ALD chamber during the deposition of TiN-comprising layer 1362 is maintained in a range from about 1 Torr to about 10 Torr and about 350° C. to about 500° C., respectively.

Deposition of layer 1360 is followed by a thermal treatment 1319 of layer 1360. Thermal treatment 1319 include but is not limited to rapid thermal annealing (RTA). Layer 1360 may be subjected to a temperature in range from about 600° C. to about 1000° C. for a time period ranging from about 10 sec to about 60 sec. Layer 1360 may be thermally treated in a $N_2$ ambient.

Figure 14:
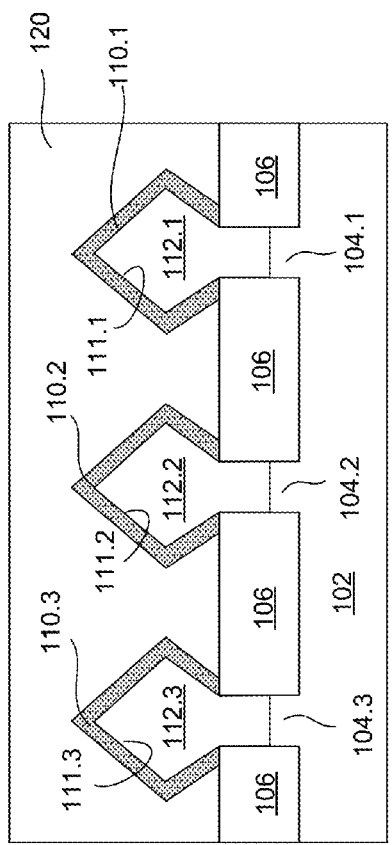

FIG. 14 is a cross-sectional view of the structure of FIG. 13 after formation of metal silicide layers 110.1 through 110.3 on S/D regions 112.1 through 112.3, respectively, and selective removal of unreacted portions of layer 1360. Metal silicide layers 110.1 through 110.3 are formed due to reaction of layer 1361 with Si-comprising SSD layers 1258.1 through 1258.3 during thermal treatment 1319 of layer 1360. During formation of metal silicide layers 110.1 through 110.3, SSD layers 1258.1 through 1258.3 may be completely consumed by metal silicide layers 110.1 through 110.3, respectively. In some embodiments, metal silicide layers 110.1 through 110.3, during its formation, may also consume portions of Si-comprising S/D regions 112.1 through 112.3 adjacent to SSD layer-S/D region interface 1259.1 (FIG. 12). SSD interfaces 111.1 through 111.3 are also formed during reaction of layer 1361 with Si-comprising SSD layers 1258.1 through 1258.3 as super-saturated dopants of SSD layers 1258.1 through 1258.3 migrate to SSD interfaces 111.1 through 111.3.

Following formation of metal silicide layers 110.1 through 110.3, unreacted portions of layer 1360, (e.g., layer 1362 and unreacted portions of layer 1361) are selectively etched leaving metal silicide layers 110.1 through 110.3 on S/D regions 112.1 through 112.3, respectively. Similar metal silicide layers 110.1 through 110.3 are formed on S/D regions 114.1 through 114.3, respectively (shown in FIG. 1). In some embodiments, for etching Ti-comprising layer 1361 and TiN-comprising layer 1362, the etching process may include using an etching mixture of HCl and $H_2O_2$ or $H_2SO_4$ and $H_2O_2$ at a temperature in a range from about 20° C. to about 200° C.

Figure 15:
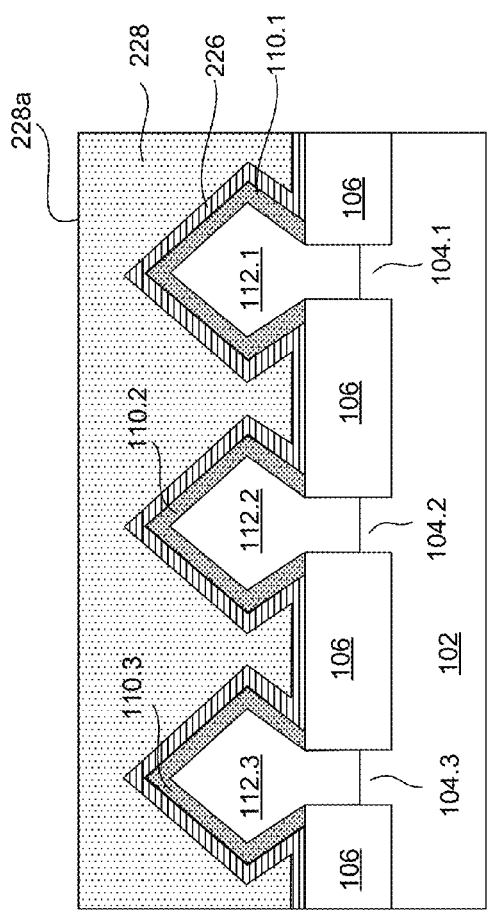

FIG. 15 is a cross-sectional view of the structure of FIG. 14 after exemplary formation of etch stop layer 226 and ILD layer 228. Etch stop layer 226 is formed on top of S/D regions 112.1 through 112.3. Etch stop layer 226 may be used as a mask layer and a protective layer to protect S/D regions 112.1 through 112.3 during subsequent formation of S/D contact structures 230 (shown in FIGS. 5A-5B and 17). In some embodiments, etch stop layer 226 is be formed of materials including, but not limited to, SiNx, SiOx, SiON, SiC, SiCN, BN, SiBN, SiCBN, and combinations thereof. Etch stop layer 226 may be formed using PECVD, SACVD, LPCVD, ALD, HDP, PEALD, MLD, PICVD, or other suitable deposition methods. In some embodiments, etch stop layer 226 includes a silicon nitride or a silicon oxide formed by LPCVD, PECVD, or CVD, or a silicon oxide formed by HARP. In an embodiment, etch stop layer 226 has a thickness in a range of about 20 nm to 200 nm. In another embodiment, etch stop layer 226 has a thickness 226t in a range of about 20 nm to about 100 nm.

Further illustrated in FIG. 15, ILD layer 228 is formed on etch stop layer 226. Formation of ILD layer 228 may include deposition of a dielectric material, followed by an annealing of the deposited dielectric material and planarization of the annealed dielectric material. The dielectric material of ILD layer 228 may be deposited using any deposition methods suitable for flowable dielectric materials (e.g., flowable silicon oxide, flowable silicon nitride, flowable silicon oxynitride, flowable silicon carbide, or flowable silicon oxycarbide). For example, flowable silicon oxide may be deposited for ILD layer 228 using FCVD process. A wet anneal process may performed on the deposited dielectric material of ILD layer 228. An illustrative wet anneal process includes annealing ILD layer 228 in steam at a temperature in a range from about 200° C. to about 700° C. for a period in a range from about 30 minutes to about 120 minutes. In an embodiment, the dielectric material is silicon oxide. The wet annealed dielectric material of ILD layer 228 may then be planarized by chemical mechanical polishing (CMP). CMP of the wet annealed dielectric material forms ILD layer 228 having top surface 228a which is coplanar with top surface 950a (shown in FIG. 9) of patterned polysilicon structure 950.

Figure 16:
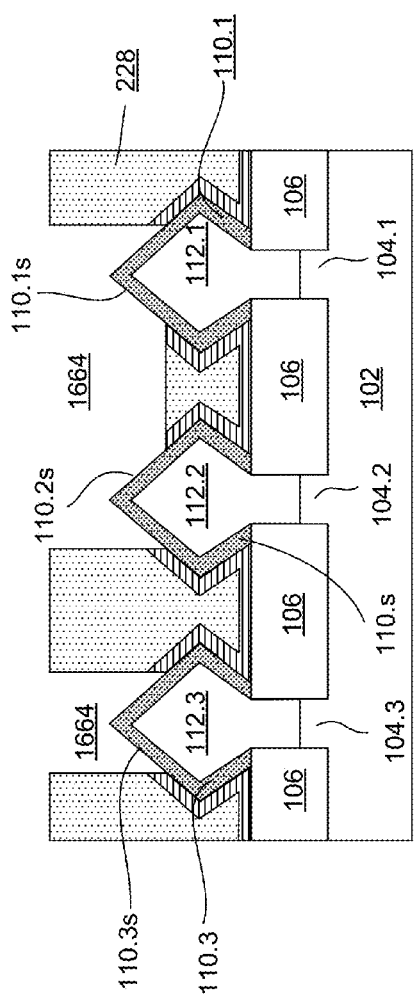
Figure 17:
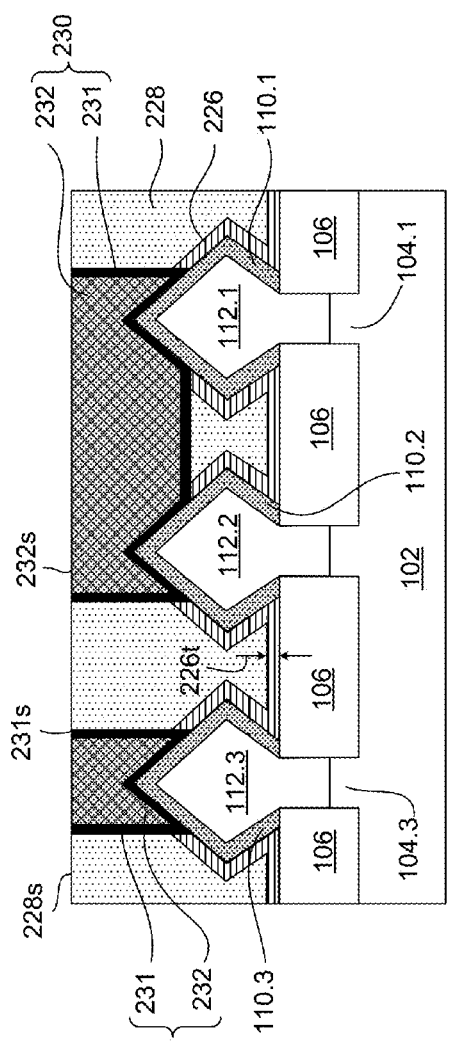

FIGS. 16-17 show various stages of an exemplary process for formation of S/D contact structures 230 and 230 of device 100. Gate contact structures 233 (shown in FIG. 5B) may be also formed simultaneously with S/D contact structures 230.

FIG. 16 is a cross-sectional view of the structure of FIG. 15 after exemplary formation of S/D contact openings 1664. S/D contact openings 1664 are formed through ILD layer 228 and etch stop layer 226 at locations above S/D regions 112.1 through 112.3. The formation of S/D contact openings 1664 includes forming a layer of photoresist (not shown) over ILD layer 228 by a suitable process, such as spin-on coating, patterning the layer of photoresist to form a patterned photoresist feature by a lithography method, and etching the exposed portions of ILD layer 228 for example, by using a dry etching, wet etching, and/or plasma etching process. This etching process removes the exposed portions of ILD layer 228 and corresponding portions of etch stop layer 226 over S/D regions 112.1 through 112.3 to expose top surface portions 110.1s through 110.3s of metal silicide layers 110.1 through 110.3, respectively. The patterned photoresist layer may be stripped thereafter. It should be noted that cross-sectional shapes of contact openings 1664 are for illustrative purposes, and are not limiting. Contact openings 1664 may have other cross-sectional shapes.

FIG. 17 is a cross-sectional view of the structure of FIG. 16 after exemplary formation of S/D contact structures 230. S/D contact structures 230 are configured to provide signals to S/D regions 112.1 through 112.3. S/D contact structures 230 includes a diffusion barrier layer 231 and a conductive layer 232.

In some embodiments, diffusion barriers 231 include a single layer or a stack of conductive materials such as, but not limited to, TiN, Ti, or Ni. In some embodiments, conductive layers 232 include conductive material such as W, Al, Co, or Cu. Formation of contact structures 230 may include a deposition process to deposit diffusion barrier layers 231 on exposed top surface portions 110.1s through 110.3s followed by a deposition process to deposit conductive layers 232, and a planarization process or an etch back process to coplanarize top surfaces 231s and 232s of respective diffusion barrier layers 231 and conductive layers 232 with top surface 228s of ILD layer 228. In some embodiments, TiN, Ti, Ni, Co, or a combination thereof is deposited by ALD or CVD. Deposition of conductive layers 232 is performed by CVD, PVD, ALD, or other suitable technique.

Formation of contacts structures 230 shown in FIG. 17 may be followed by formation of other structures such as vias, interconnect metal layers, dielectric layers, passivation layers, etc., that, for the sake of clarity, are not shown.

FIGS. 18-21 show various stages of another exemplary process for formation of metal silicide layers 110.1 through 110.3 and SSD interfaces 111.1 through 111.3 of device 100.

FIG. 18 is a cross-sectional view of the structure of FIG. 11 along line A-A after exemplary formation of capping layers 1870.1 through 1870.3 on S/D regions 112.1 through 112.3, respectively. Similar capping layers are also grown on S/D regions 114.1 through 114.3 (not shown in FIG. 18). Capping layers 1870.1 through 1870.3 may be similar in structure and composition to SSD layers 1258.1 through 1258.3 except for their doping concentration. Capping layers 1870.1 through 1870.3 have a unsaturated doping concentration, which is lower than the super-saturated dopant concentration of SSD layers 1258.1 through 1258.3. Deposition process of capping layers 1870.1 through 1870.3 may be similar to deposition process of SSD layers 1258.1 through 1258.3 except for unsaturated doping of capping layers 1870.1 through 1870.3. In some embodiments, capping layers 1870.1 through 1870.3 are in-situ doped to have a dopant concentration of B, P, In, Ga, As, or other dopants that is equal or smaller than 1E21 atoms/cm$^3$.

FIG. 19 is a cross-sectional view of the structure of FIG. 18 after deposition of layer 1360 on capping layers 1870.1 through 1870.3 and thermal treatment of layer 1360. Deposition process of layer 1360 and thermal treatment of layer 1360 are similar to that described above with reference to FIG. 13.

Figure 20:
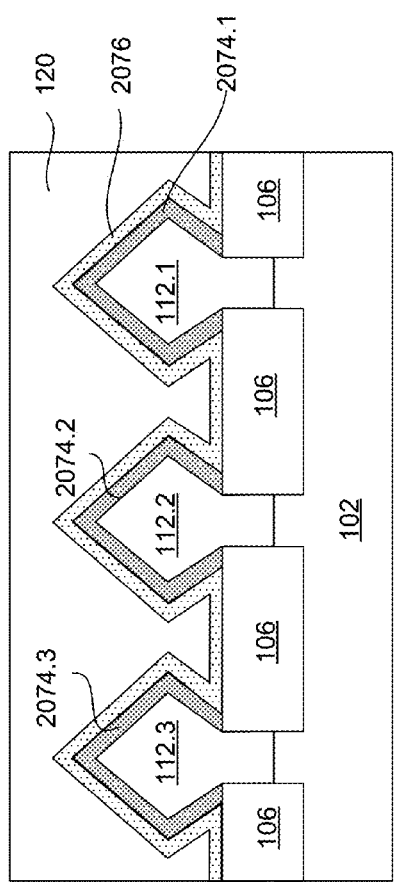

FIG. 20 is a cross-sectional view of the structure of FIG. 19 after formation of metal silicide layers 2074.1 through 2074.3 on S/D regions 112.1 through 112.3, respectively, selective removal of unreacted portions of layer 1360, and formation of SSD layers 2076.1 through 2074.3. Metal silicide layers 2074.1 through 2074.3 are formed due to reaction of layer 1361 with Si-comprising capping layers 1870.1 through 1870.3 during thermal treatment of layer 1360. During formation of metal silicide layers 2074.1 through 2074.3, capping layers 1870.1 through 1870.3 may be completely consumed by metal silicide layers 2074.1 through 2074.3, respectively. Following formation of metal silicide layers 2074.1 through 2074.3, unreacted portions of layer 1360, (e.g., layer 1362 and unreacted portions of layer 1361) are selectively etched in a manner similar to that described above with reference to FIG. 14.

Following the etching process, SSD layer 2076 is deposited on metal silicide layers 2074.1 through 2074.3. SSD layers 2076 is similar in structure, thickness, and composition to SSD layers 1258.1 through 1258.3. In some embodiments, SSD layer 2076 is conformally deposited on metal silicide layers 2074.1 through 2074.3 using, for example, a CVD process. SSD layer 20769 may be in-situ super-saturated doped in the CVD growth chamber during its deposition process using p-type or n-type doping precursors such as, but not limited to, $B_2H_6$, $BF_3$ for p-type super-saturated doping; $PH_3$, $AsH_3$ for n-type super saturated doping. In some embodiments, SSD layer 2076 is in-situ doped to have a super-saturated dopant concentration of B, P, In, Ga, As, or other dopants that is greater than 1E21 atoms/cm$^3$, 1E22 atoms/cm$^3$, or 1E23 atoms/cm$^3$. Structure of FIG. 20 after deposition of SSD layer 2076 may be thermally treated by an RTA process at a temperature in a range from about 600° C. to about 1000° C. for a period in a range from about 10 sec to about 60 sec.

Figure 21:
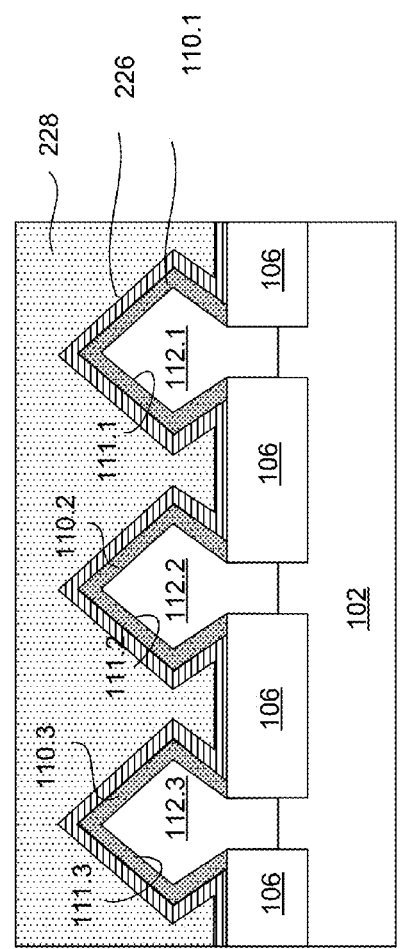

FIG. 21 is a cross-sectional view of the structure of FIG. 20 after exemplary formation of metal silicide layers 110.1 through 110.3 on S/D regions 112.1 through 112.3, respectively, selective removal of unreacted portions of SSD layer 2076 on STI regions 106, and formation of etch stop layer 226 and ILD layer 228. Metal silicide layers 110.1 through 110.3 are formed due to reaction of Si-comprising SSD layer 2076 with metal silicide layers 2074.1 through 2074.3 during thermal treatment of SSD layer 2076. Portions of SSD layer 2076 on metal silicide layers 2074.1 through 2074.3 may be completely consumed by metal silicide layers 110.1 through 110.3, respectively, during their formation. Portions of SSD layer 2076 on STI regions 106 may remain unreacted and are selectively etched off. SSD interfaces 111.1 through 111.3 are also formed during reaction of Si-comprising SSD layer 2076 with metal silicide layers 2074.1 through 2074.3.

Following the selective removal of unreacted portions of SSD layer 2076, etch stop layer 226 and ILD layer 228 are formed on metal silicide layers 110.1 through 110.3 in a manner similar to that described above with reference to FIG. 15.

Example Operations for Fabricating a Device

FIG. 22 is a flow diagram of an exemplary method 2200 for fabricating device 100. Solely for illustrative purposes, the operations illustrated in FIG. 22 will be described with reference to the example fabrication process illustrated in FIGS. 6-17. Operations can be performed in a different order or not performed depending on specific applications. It should be noted that method 2200 does not produce a completed device 100. Accordingly, it is understood that additional processes may be provided before, during, and after method 2200, and that some other processes may only be briefly described herein.

In operation 2210, S/D regions are formed on recessed fin portions. For example, S/D regions 112.1 through 112.3 are formed on fin portions 1054 of fins 104.1 through 104.3. S/D regions 112.1 through 112.3 include epitaxially-grown semiconductor material. The epitaxially-grown semiconductor material may be formed by an epitaxial deposition/partial etch process, which repeats the epitaxial deposition/partial etch process at least once. Such repeated deposition/partial etch process is also called a cyclic deposition-etch (CDE) process.

In operation 2220, SSD layers are formed on S/D regions of operation 2210. For example, SSD layers 1258.1 through 1258.3 are formed on S/D regions 112.1 through 112.3, respectively. In some embodiments, SSD layers 1258.1 through 1258.3 and S/D regions 112.1 through 112.3 are grown in-situ using an epitaxial deposition process. The epitaxial processes for growing SSD layers 1258.1 through 1258.3 may include CVD deposition techniques (e.g., LPCVD, VPE and/or UHV-CVD), MBE, and/or other suitable processes. In some embodiments, SSD layers 1258.1 through 1258.3 and S/D regions 112.1 through 112.3 are grown using different deposition processes. In some embodiments, SSD layers 1258.1 through 1258.3 are conformally deposited on S/D regions 112.1 through 112.3, respectively, using, for example, a CVD process. SSD layers 1258.1 through 1258.3 are amorphous or polycrystalline in structure and includes a semiconductor material. Examples of the semiconductor material include Ge, Si, GaAs, AlGaAs, SiGe, GaAsP, or a combination thereof.

In operation 2230, a layer is deposited on SSD layers of operation 2220. For example, layer 1360 is deposited on SSD layers 1258.1 through 1258.3. Layer 1360 may include a single layer 1361 or a stack of layers such as layers 1360 and 1362. Layer 1361 may include a metal such as, but not limited to, Co, Ni, Ti, W, Mo, other refractory metals, or a combination thereof. Layer 1362 may include nitride materials such as TiN and may act as a protective layer for layer

1361. Layer 1360 may be deposited using any suitable deposition process, such as, but not limited to, CVD, PECVD, or ALD.

In operation 2240, metal silicide layers are formed on S/D regions of operation 2210 and SSD interfaces are formed between the metal silicide layers and the S/D regions. For example, metal silicide layers 110.1 through 110.3 are formed on S/D regions 112.1 through 112.3, respectively, due to reaction of layer 1361 with Si-comprising SSD layers 1258.1 through 1258.3 during thermal treatment of layer 1360. SSD interfaces 111.1 through 111.3 are formed during reaction of layer 1361 with Si-comprising SSD layers 1258.1 through 1258.3.

In operation 2250, an ILD layer is formed on the metal silicide layers of operation 2240. For example, ILD layer 228 is formed on metal silicide layers 110.1 through 110.3. Formation of ILD layer 228 may include deposition of a dielectric material, followed by an annealing of the deposited dielectric material and planarization of the annealed dielectric material. The dielectric material of ILD layer 228 may be deposited using any deposition methods suitable for flowable dielectric materials. For example, flowable silicon oxide is deposited for ILD layer 228 using FCVD process. A wet anneal process is performed on the deposited dielectric material of ILD layer 228. The wet annealed dielectric material of ILD layer 228 may then be planarized by CMP.

In operation 2260, S/D contact structures are formed within the ILD layer of operation 2250 and on the SSD interfaces of operation 2240. For example S/D contact structures 230 are formed as described with reference to FIGS. 16-17.

FIG. 23 is a flow diagram of another exemplary method 2300 for fabricating device 100. Solely for illustrative purposes, the operations illustrated in FIG. 23 will be described with reference to the example fabrication process illustrated in FIGS. 6-21. Operations can be performed in a different order or not performed depending on specific applications. It should be noted that method 2300 does not produce a completed device 100. Accordingly, it is understood that additional processes may be provided before, during, and after method 2300, and that some other processes may only be briefly described herein.

In operation 2310, S/D regions are formed on recessed fin portions. For example, S/D regions 112.1 through 112.3 are formed on fin portions 1054 of fins 104.1 through 104.3. S/D regions 112.1 through 112.3 include epitaxially-grown semiconductor material. The epitaxially-grown semiconductor material may be formed by an epitaxial deposition/partial etch process, which repeats the epitaxial deposition/partial etch process at least once. Such repeated deposition/partial etch process is also called a cyclic deposition-etch (CDE) process.

In operation 2320, capping layers are formed on S/D regions of operation 2310. For example, capping layers 1870.1 through 1870.3 on S/D regions 112.1 through 112.3, respectively, as described with reference to FIGS. 12 and 18.

In operation 2330, first metal silicide layers are formed on S/D regions of operation 2310. For example, metal silicide layers 2074.1 through 2074.3 are formed on S/D regions 112.1 through 112.3, respectively, as described with reference to FIG. 20.

In operation 2340, an SSD layer is formed on first metal silicide layers of operation 2330. For example, SSD layer 2076 is formed on metal silicide layers 2074.1 through 2074.3, as described with reference to FIGS. 12 and 20.

In operation 2350, second metal silicide layers are formed on S/D regions of operation 2310 and SSD interfaces are formed between the second metal silicide layers and the S/D regions. For example, second metal silicide layers 110.1 through 110.3 are formed on S/D regions 112.1 through 112.3, respectively, and SSD interfaces 111.1 through 111.3 are formed as described with reference to FIG. 21.

In operation 2360, an ILD layer is formed on the second metal silicide layers of operation 2350. For example, ILD layer 228 is formed on metal silicide layers 110.1 through 110.3 as described with reference to FIG. 21.

Thus, the present disclosure describes methods of reducing contact resistance between metal silicides and S/D regions of a finFET and improving thermal stability of the metal silicides during subsequent high temperature processing of the finFET. Improving thermal stability of metal silicides helps to substantially prevent agglomeration of metal silicides at high temperature processing, and consequently prevent increase in contact resistance between metal silicides and S/D regions. In an embodiment, the method includes forming super-saturated doped interfaces between metal silicides and S/D regions having a dopant concentration greater than 1E22 atoms/cm$^3$ or 1E23 atoms/cm$^3$ without the use of high energy implantation processes that are damaging to metal silicide-S/D region interfaces.

Example Embodiments and Benefits

In an embodiment, a method of forming a semiconductor device includes forming a fin on a substrate and forming a source/drain region on the fin. The method further includes forming a doped metal silicide layer on the source/drain region and forming a super-saturated doped interface between the doped metal silicide and the source/drain region. An exemplary benefit of this embodiment is the lowering of contact resistance between metal silicide layers and source/drain regions by providing super-saturated doping at interfaces between metal silicide layers and source/drain regions for better contact between them compared to current device.

In a further embodiment, a method of forming a semiconductor device includes forming a fin on a substrate and epitaxially growing a source/drain region on the fin. The method further includes forming a first metal silicide layer on the source/drain region, depositing a super-saturated doped layer on the first metal silicide layer, and forming a second metal silicide layer on the source/drain region. Another exemplary benefit of this embodiment is the lowering of contact resistance between metal silicide layers and source/drain regions by providing super-saturated doping at interfaces between metal silicide layers and source/drain regions for better contact between them compared to current device.

In a still further embodiment, a semiconductor device includes a fin on a substrate, an isolation region disposed on the substrate, and a source/drain region disposed on the fin. The device further includes a doped metal silicide layer disposed on at least a portion of the source/drain region that extends above a top surface of the isolation region and a super-saturated doped interface between the doped metal silicide layer and the source/drain region. An exemplary benefit of this embodiment is the lowering of contact resistance between metal silicide layers and source/drain regions by providing super-saturated doping at interfaces between metal silicide layers and source/drain regions for better contact between them compared to current device.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming a fin on a substrate;
    forming a source/drain region on the fin;
    forming a first metal silicide layer on the source/drain region;
    depositing a super-saturated doped layer on the first metal silicide layer, wherein the super-saturated doped layer has a dopant concentration that is greater than a solubility limit of the dopant in the super-saturated doped layer; and
    forming a second doped metal silicide layer on the source/drain region based on a reaction between the super-saturated doped layer and the first metal silicide layer.

2. The method of claim 1, wherein the source/drain region comprises a crystalline structure and the super-saturated doped layer comprises an amorphous or polycrystalline structure.

3. The method of claim 1, wherein the dopant concentration is greater than 1E22 atoms/cm$^3$ or 1E23 atoms/cm$^3$.

4. The method of claim 1, wherein the super-saturated doped layer comprises an amorphous or polycrystalline structure.

5. The method of claim 1, further comprising depositing an etch stop layer on the super-saturated doped layer.

6. The method of claim 5, further comprising:
    depositing an interlayer dielectric (ILD) layer on the etch stop layer.

7. The method of claim 6, further comprising forming a source/drain contact opening on the second metal silicide layer.

8. The method of claim 7, wherein forming the source/drain contact opening comprises
    etching a portion of the ILD layer on the etch stop layer.

9. The method of claim 1, wherein forming the second doped metal silicide layer comprises annealing the super-saturated doped layer and the first metal silicide layer.

10. The method of claim 1, wherein depositing the super-saturated doped layer comprises epitaxially growing a super-saturated doped layer on the first metal silicide layer.

11. The method of claim 10, wherein the epitaxially-grown super-saturated doped layer is substantially conformal on the first metal silicide layer.

12. A method of forming a semiconductor device, comprising:
    forming a fin on a substrate;
    epitaxially growing a source/drain region on the fin;
    forming a first metal silicide layer on the source/drain region;
    depositing a super-saturated doped layer on the first metal silicide layer, wherein the super-saturated doped layer has first dopant concentration; and
    forming a second metal silicide layer on the source/drain region based on a reaction between the super-saturated doped layer and the first metal silicide layer.

13. The method of claim 12, wherein forming the second metal silicide layer comprises annealing the first metal silicide layer and the super-saturated doped layer.

14. The method of claim 12, wherein the first dopant concentration is greater than 1E22 atoms/cm$^3$ or 1E23 atoms/cm$^3$.

15. The method of claim 12, wherein forming the first metal silicide layer comprises depositing a Si-comprising layer having a second dopant concentration that is smaller than the first dopant concentration.

16. A semiconductor device, comprising:
    a fin disposed on a substrate;
    an isolation region disposed on the substrate;
    a source/drain region disposed on the fin;
    a doped metal silicide layer disposed on the source/drain region that extends above a top surface of the isolation region; and
    a super-saturated doped interface between the doped metal silicide layer and the source/drain region, wherein the super-saturated doped interface wraps around the source/drain region that extends above the top surface of the isolation region and has a dopant concentration that is greater than a solubility limit of the dopant in the super-saturated doped interface.

17. The semiconductor device of claim 16, wherein the dopant concentration is greater than 1E22 atoms/cm$^3$ or 1E23 atoms/cm$^3$.

18. The semiconductor device of claim 16, further comprises an insulating layer disposed on the doped metal silicide layer.

19. The semiconductor device of claim 16, wherein the doped metal silicide layer comprises Ti, Co, Ni, or W.

20. The semiconductor device of claim 16, wherein a contact resistance between the doped metal silicide layer and the source/drain region is smaller than 1E-9 ohm/cm$^2$ or 1E-10 ohm/cm$^2$.

* * * * *

UNITED STATES PATENT AND TRADEMARK OFFICE
CERTIFICATE OF CORRECTION

PATENT NO. : 9,997,631 B2  
APPLICATION NO. : 15/226321  
DATED : June 12, 2018  
INVENTOR(S) : Yang et al.

Page 1 of 2

It is certified that error appears in the above-identified patent and that said Letters Patent is hereby corrected as shown below:

On the Title Page

Item (54) and in the Specification, Column 1, Line 2, delete "SEMICONDUCTORS" and insert -- SEMICONDUCTOR --, therefor.

Column 1, item (*), in "Notice", Line 3, delete "days. days." and insert -- days. --, therefor.

In the Drawings

On Sheet 11 of 13, Fig. 19, delete " 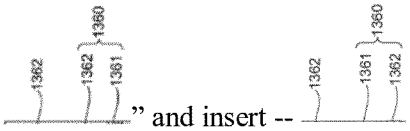 " and insert -- -- , therefor.

In the Specification

1. In Column 1, Line 4, insert -- CROSS-REFERENCE TO RELATED APPLICATION
This application claims priority to U.S. Provisional Patent Application No. 62/345,576, filed on Jun. 3, 2016, titled "Methods for Reducing Contact Resistance in Semiconductor Manufacturing Process," which is incorporated herein by reference in its entirety. --.

2. In Column 3, Line 23, delete "oposing" and insert -- opposing --, therefor.

3. In Column 5, Line 13, delete "tantulum" and insert -- tantalum --, therefor.

4. In Column 11, Line 17, delete "hardmask" and insert -- hard mask --, therefor.

5. In Column 11, Line 63, delete "oxy-nitride," and insert -- oxynitride, --, therefor.

6. In Column 13, Lines 56-57, delete "dicholorosilane," and insert -- dichlorosilane, --, therefor.

Signed and Sealed this  
Twenty-first Day of April, 2020

Andrei Iancu  
*Director of the United States Patent and Trademark Office*

CERTIFICATE OF CORRECTION (continued)
U.S. Pat. No. 9,997,631 B2

7. In Column 14, Lines 5-6, delete "super saturated" and insert -- super-saturated --, therefor.

8. In Column 14, Line 15, change from 1360 to 1361.

9. In Column 17, Lines 12, delete "a unsaturated" and insert -- an unsaturated --, therefor.

10. In Column 17, Lines 54, delete "super saturated" and insert -- super-saturated --, therefor.

In the Claims

11. In Column 22, Line 12, Claim 12, delete "has first" and insert -- has a first --, therefor.